US012813125B2

(12) United States Patent
Li

(10) Patent No.: US 12,813,125 B2
(45) Date of Patent: Nov. 24, 2026

(54) DISPLAY DEVICE AND MANUFACTURING METHOD THEREOF

(71) Applicant: Samsung Display Co., LTD., Yongin-si (KR)

(72) Inventor: Xinxing Li, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 308 days.

(21) Appl. No.: 18/634,217

(22) Filed: Apr. 12, 2024

(65) Prior Publication Data

US 2025/0143132 A1 May 1, 2025

(30) Foreign Application Priority Data

Oct. 25, 2023 (KR) ........................ 10-2023-0144222

(51) Int. Cl.
*H10K 59/38* (2023.01)
*H10K 59/80* (2023.01)
*H10K 102/00* (2023.01)

(52) U.S. Cl.
CPC ........... *H10K 59/38* (2023.02); *H10K 59/877* (2023.02); *H10K 59/8792* (2023.02); *H10K 2102/331* (2023.02)

(58) Field of Classification Search
CPC ......... H10K 59/80515; H10K 59/1201; H10K 59/122; H10K 2102/331; H10H 20/80
See application file for complete search history.

(56) References Cited

U.S. PATENT DOCUMENTS

| | | | | |
|---|---|---|---|---|
| 6,440,761 B1 * | 8/2002 | Choi | B82Y 10/00 313/309 |
| 9,064,822 B2 * | 6/2015 | Park | H10K 59/131 |
| 2005/0191448 A1 * | 9/2005 | Suh | B41M 5/38207 257/E29.296 |
| 2012/0032138 A1 * | 2/2012 | Kim | H10K 50/10 438/46 |
| 2014/0367721 A1 * | 12/2014 | Mahler | B82Y 30/00 977/773 |
| 2021/0351247 A1 * | 11/2021 | Hack | G09G 3/3275 |

(Continued)

FOREIGN PATENT DOCUMENTS

| | | |
|---|---|---|
| KR | 10-2022-0046043 | 4/2022 |
| KR | 10-2022-0126856 | 9/2022 |
| KR | 10-2023-0047273 | 4/2023 |

*Primary Examiner* — Mary Ellen Bowman
(74) *Attorney, Agent, or Firm* — CANTOR COLBURN LLP

(57) ABSTRACT

A sub-pixel area includes first to third sub-pixel areas. A light controlling layer includes a first color conversion layer in which at least a portion thereof is disposed in the first sub-pixel area and including first quantum-dots, a second color conversion layer in which at least a portion thereof is disposed in the second sub-pixel area and including second quantum-dots, and a light transmitting partition wall structure disposed across the third sub-pixel area and a non-sub-pixel area. The light transmitting partition wall structure includes a light transmitting layer disposed in the third sub-pixel area and a bank disposed in the non-sub-pixel area. Each of the first color conversion layer and the second color conversion layer includes a central area and an arm area extending in two or more different directions from the central area in a plan view.

20 Claims, 23 Drawing Sheets

(56) References Cited

U.S. PATENT DOCUMENTS

| | | | | |
|---|---|---|---|---|
| 2022/0263039 | A1* | 8/2022 | Angioni | H10K 50/115 |
| 2022/0293685 | A1* | 9/2022 | Lee | H10K 59/38 |
| 2023/0102623 | A1 | 3/2023 | Jeong et al. | |
| 2024/0040917 | A1 | 2/2024 | Kim et al. | |
| 2024/0130150 | A1* | 4/2024 | Cheng | H10K 71/60 |
| 2024/0244915 | A1* | 7/2024 | Shin | H10K 59/122 |

* cited by examiner

DISPLAY DEVICE AND MANUFACTURING METHOD THEREOF

CROSS-REFERENCE TO RELATED APPLICATION(S)

This application claims priority to Korean Patent Application No. 10-2023-0144222 under 35 U.S.C. § 119, filed on Oct. 25, 2023 in the Korean Intellectual Property Office, the entire contents of which are incorporated by reference herein.

BACKGROUND

(a) Technical Field

The disclosure relates to a display device and a manufacturing method thereof.

(b) Description of the Related Art

Recently, as interest in an information display is increasing, research and development for display devices are continuously conducted.

SUMMARY

An aspect of the disclosure is to provide a display device and a manufacturing method thereof that may improve process performance and reduce process costs.

Another aspect of the disclosure is to provide a display device and a manufacturing method thereof in which a light emitting area may be carefully designed so that a non-light emitting area may be reduced.

An embodiment of the disclosure may provide a display device.

The display device may include a sub-pixel area and a non-sub-pixel area. The display device may include a display layer, and a light controlling layer disposed on the display layer. The sub-pixel area may include a first sub-pixel area, a second sub-pixel area, and a third sub-pixel area. The light controlling layer may include a first color conversion layer in which at least a portion thereof is disposed in the first sub-pixel area and including first quantum-dots, a second color conversion layer in which at least a portion thereof is disposed in the second sub-pixel area and including second quantum-dots, and a light transmitting partition wall structure disposed across the third sub-pixel area and the non-sub-pixel area. The light transmitting partition wall structure may include a light transmitting layer disposed in the third sub-pixel area and a bank disposed in the non-sub-pixel area. Each of the first color conversion layer and the second color conversion layer may include a central area and an arm area extending in two or more different directions from the central area in a plan view.

The display device may include pixel rows in which the sub-pixel area is formed, that extend in a first direction, and that include pixel rows adjacent to each other in a second direction different from the first direction. The central area may overlap the non-sub-pixel area in a plan view, and may be disposed between the pixel rows adjacent to each other.

The central area may include a first central area included in the first color conversion layer and a second central area included in the second color conversion layer. The arm area may include a first arm area included in the first color conversion layer and a second arm area included in the second color conversion layer. The first central area may overlap the first sub-pixel area along the second direction, and may not overlap the first sub-pixel area along the first direction. The second central area may overlap the second sub-pixel area along the second direction, and may not overlap the second sub-pixel area along the first direction. At least a portion of the first arm area may be disposed in the first sub-pixel area. At least a portion of the second arm area may be disposed in the second sub-pixel area.

The first arm area may include a sub-area, a second sub-area, a third sub-area, and a fourth sub-area that each extend in different directions in a plan view. The second arm area may include a first sub-area, a second sub-area, a third sub-area, and a fourth sub-area that each extend in different directions in a plan view.

The first sub-pixel area may include first sub-pixel areas that are disposed respectively in the adjacent pixel rows to be spaced apart from each other in the second direction. The first sub-area of the first arm area may be disposed in one of the first sub-pixel areas and the third sub-area of the first arm area may be disposed in another of the first sub-pixel areas. The second sub-area of the first arm area and the fourth sub-area of the first arm area may be disposed between the adjacent pixel rows.

The first sub-area of the first arm area, the second sub-area of the first arm area, the first sub-area of the second arm area, and the second sub-area of the second arm area may extend in a direction parallel to the first direction. The third sub-area of the first arm area, the fourth sub-area of the first arm area, the third sub-area of the second arm area, and the fourth sub-area of the second arm area may extend in a direction parallel to the second direction. Each of the third sub-area of the first arm area, the fourth sub-area of the first arm area, the third sub-area of the second arm area, and the fourth sub-area of the second arm area may have a first width. Each of the first sub-area of the first arm area, the second sub-area of the first arm area, the first sub-area of the second arm area, and the second sub-area of the second arm area may have a second width. The first width may be greater than the second width.

The first color conversion layer may include first cross structures spaced apart from each other. The second color conversion layer may include second cross structures spaced apart from each other. The first and second cross structures may be respectively arranged in a matrix structure based on a first direction and a second direction different from the first direction. Each of the first cross structures may include a first central portion. Each of the second cross structures may include a second central portion. A virtual line connecting the first central portion and the second central portion may extend in a diagonal direction different from the first direction and the second direction.

The first central portion and the second central portion may form an offset with respect to the first direction.

The light controlling layer may further include color filters that are disposed on the first color conversion layer, the second color conversion layer, and the light transmitting partition wall structure; and a light blocking layer disposed on the bank in the non-sub-pixel area.

The bank and the light transmitting layer may be integral to each other.

The light transmitting partition wall structure may include a scatterer.

The central area may have at least one of a quadrangular shape, a circular shape, and an elliptical shape.

The first central area and the second central area may further include edge portions that do not overlap the first arm area and the second arm area along the first direction, respectively.

The first central area may be closer to the third sub-pixel area than to the second sub-pixel area. The second central area may be closer to the third sub-pixel area than to the first sub-pixel area.

The first central area may include a first central portion. The second central area may include a second central portion. The first central portion may be closer to the third sub-pixel area than to the second sub-pixel area with respect to a central line of the first sub-pixel area. The second central portion may be closer to the third sub-pixel area than to the first sub-pixel area with respect to a central line of the second sub-pixel area.

Another embodiment of the disclosure provides a display device. The display device may include a display layer; a first color conversion layer disposed on the display layer and that includes quantum-dots, and a second color conversion layer disposed on the display layer and that includes quantum-dots. The first color conversion layer may include first cross structures spaced apart from each other. The second color conversion layer may include second cross structures spaced apart from each other. The first and second cross structures may be respectively arranged in a matrix structure based on a first direction and a second direction different from the first direction. Each of the first cross structures may include a first central portion. Each of the second cross structures may include a second central portion. A virtual line connecting the first central portion and the second central portion may extend in a diagonal direction different from the first direction and the second direction.

Another embodiment of the disclosure provides a manufacturing method of display device. The method may include manufacturing a display layer including a first substrate, and manufacturing a light controlling layer including a second substrate. The manufacturing of the light controlling layer may include patterning color filters on the second substrate, patterning a light transmitting partition wall structure on the color filters, patterning a first color conversion layer on the color filters, and patterning a second color conversion layer on the color filters. The patterning of the light transmitting partition wall structure may include forming a first opening by the light transmitting partition wall structure and forming a second opening by the light transmitting partition wall structure. The first opening may include a first central opening and a first arm opening extending from the first central opening. The second opening may include a second central opening and a second arm opening extending from the second central opening. The patterning of the first color conversion layer may include supplying a first ink including first quantum-dots to the first opening. The patterning of the second color conversion layer may include supplying a second ink including second quantum-dots to the second opening.

The first arm opening may include two or more first arm openings extending in different directions. The second arm opening may include two or more second arm openings extending in different directions.

The patterning of the first color conversion layer may include simultaneously disposing the first color conversion layer in the first sub-pixel areas respectively corresponding to pixel rows.

The color filters may include a first color filter, a second color filter, and a third color filter. The patterning of the color filters may include forming a light blocking structure by the first color filter, the second color filter, and the third color filter. The manufacturing method may further include patterning a light blocking layer on at least a portion of the light transmitting partition wall structure.

According to an embodiment of the disclosure, a display device and a manufacturing method thereof that may improve process performance and reduce process costs may be provided.

According to an embodiment of the disclosure, a display device and a manufacturing method thereof in which a light emitting area may be carefully designed so that a non-light emitting area may be reduced may be provided.

DETAILED DESCRIPTION OF THE EMBODIMENTS

Figure 1:
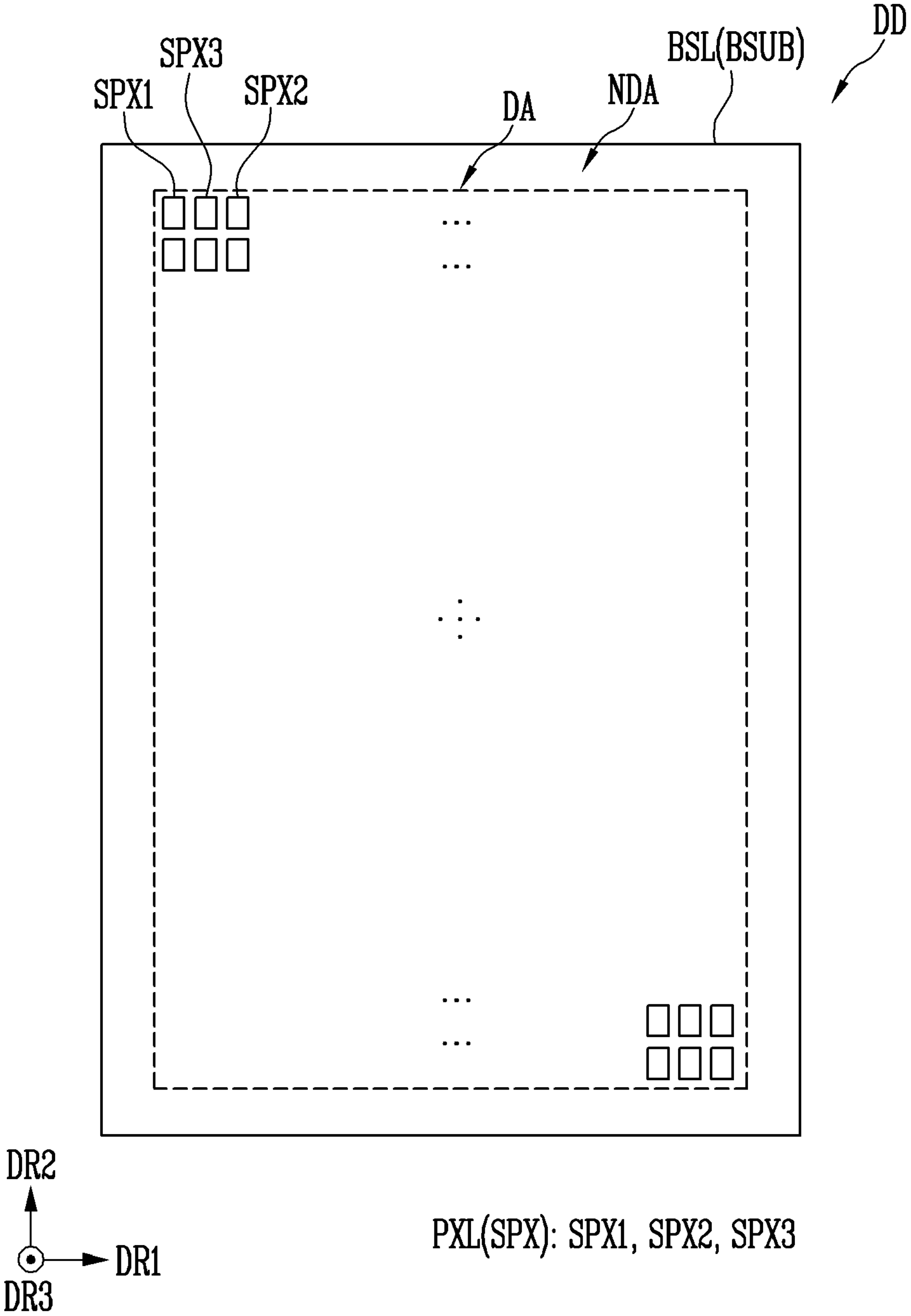
FIG. 1 illustrates a schematic top plan view of a display device according to an embodiment.

Since the disclosure may be variously modified and have various forms, only some embodiments will be illustrated and described in detail in the following. These embodiments, however, by no means restrict the disclosure to the specific embodiments, and it is to be understood as embracing all changes, equivalents, and substitutes included in the spirit and scope of the disclosure.

Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the disclosure. Singular forms are intended to include plural forms unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

In the disclosure, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

It will be understood that when an element such as a layer, film, region, area, or substrate is referred to as being "on" another element, it can be directly on the other element or intervening elements may also be present. In addition, in the specification, when a portion of a layer, film, region, area, plate, or the like is referred to as being formed "on" another portion, the formed direction is not limited to an upper direction but includes a lateral or lower direction. When an element of a layer, film, region, area, plate, or the like is referred to as being "below" another element, it may be directly below the other element, or intervening elements may be present.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a schematic top plan view of a display device according to an embodiment.

Referring to FIG. 1, a display device DD may include a base layer BSL, and pixels PXL disposed on the base layer BSL. Although not shown in the drawing, the display device DD may further include a driving circuit part (for example, a scan driver and a data driver) for driving a pixel PXL, wires, and pads.

The display device DD (or the base layer BSL) may include a display area DA and a non-display area NDA. The non-display area NDA may mean an area other than the display area DA. The non-display area NDA may surround at least a portion of the display area DA.

The base layer BSL may form a base surface of the display device DD. In some embodiments, the base layer BSL may include a lower substrate BSUB (see FIG. 3).

The base layer BSL may be a rigid or flexible substrate or film. For example, the base layer BSL may include a glass material. In other embodiments, the base layer BSL may include a silicon material. In other embodiments, the base layer BSL may include polyimide. However, the disclosure is not limited thereto.

The display area DA may mean an area in which the pixels PXL are disposed. The non-display area NDA may mean an area in which the pixel PXL is not disposed. In the non-display area NDA, a driving circuit portion, wires, and pads connected to the pixel PXL of the display area DA may be disposed.

According to an embodiment, pixels PXL (for example, sub-pixels SPX) may be formed according to various arrangement structures. For example, the pixels PXL (for example, the sub-pixels SPX) may be arranged according to a stripe arrangement structure and the like.

According to an embodiment, a pixel PXL (or the sub-pixels SPX) may include a first sub-pixel SPX1, a second sub-pixel SPX2, and third sub-pixel SPX3. Each of the first sub-pixel SPX1, the second sub-pixel SPX2, and the third sub-pixel SPX3 may be a sub-pixel. At least one of the first sub-pixel SPX1, the second sub-pixel SPX2, and the third sub-pixel SPX3 may form a pixel unit capable of emitting light of various colors.

Each of the first sub-pixel SPX1, the second sub-pixel SPX2, and the third sub-pixel SPX3 may emit light of a color.

For example, the first sub-pixel SPX1 may be a red pixel emitting red (for example, first color) light, and the second sub-pixel SPX2 may be a green pixel emitting green (for example, second color) light, and the third sub-pixel SPX3 may be a blue pixel emitting blue (for example, third color) light. The red pixel may provide light in a wavelength band of 600 nm to 750 nm. The green pixel may provide light in a wavelength band of 480 nm to 560 nm. The blue pixel may provide light in a wavelength band of 370 nm to 460 nm.

Figure 2:
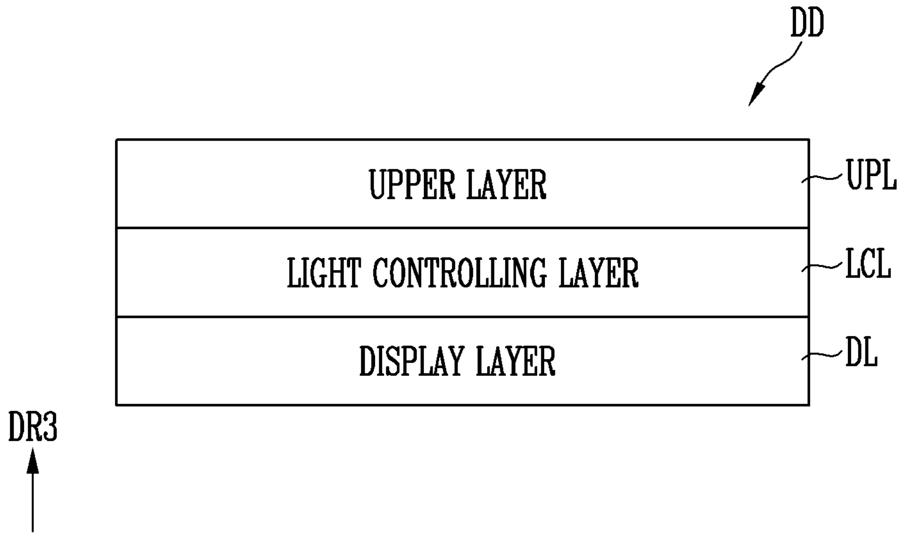
FIG. 2 illustrates a schematic cross-sectional view of a display device according to an embodiment.
Figure 3:
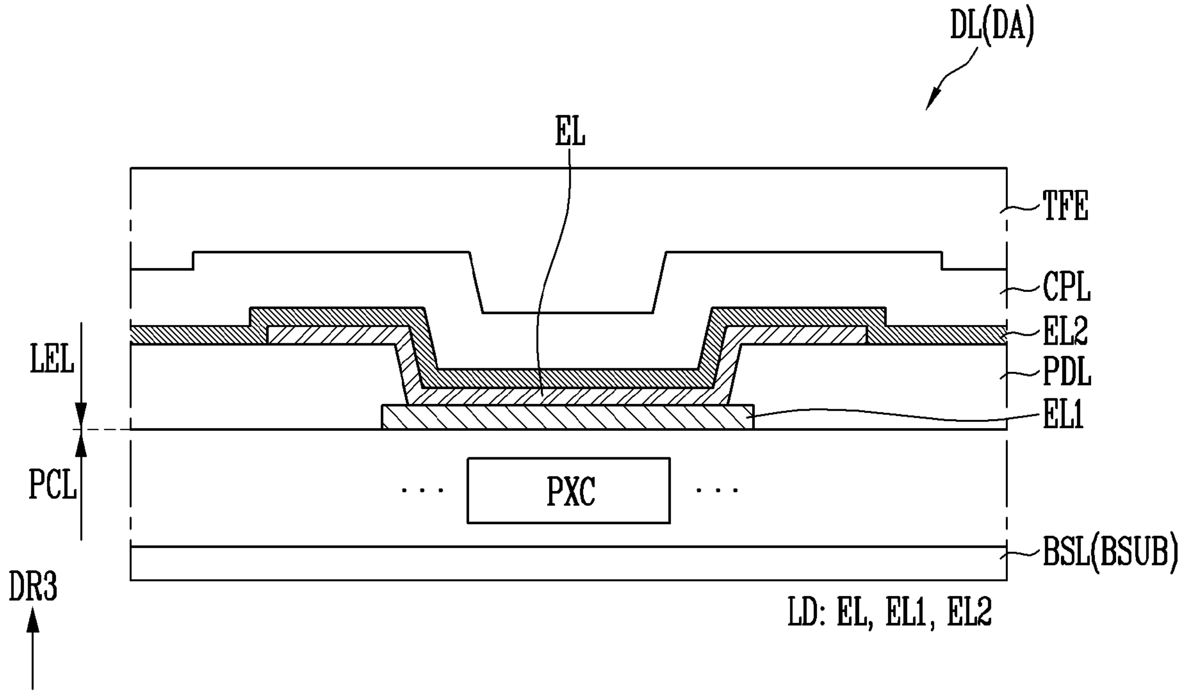
FIG. 3 illustrates a schematic cross-sectional view of a display layer according to an embodiment.

FIG. 2 illustrates a schematic cross-sectional view of a display device according to an embodiment. FIG. 3 illustrates a schematic cross-sectional view of a display layer according to an embodiment.

Referring to FIG. 2 and FIG. 3, the display device DD may include a display layer DL, a light controlling layer LCL, and an upper layer UL.

The display layer DL may be configured to emit light. The display layer DL may form a base on which the light controlling layer LCL is disposed.

The display layer DL may include a pixel circuit layer PCL including the base layer BSL, and a light emitting element layer LEL including a light emitting element LD to be able to form the pixel PXL.

The base layer BSL may form a base on which a pixel circuit PXC is disposed. The pixel circuit PXC may be disposed on the base layer BSL and may be configured to drive the light emitting element LD. The pixel circuit layer PCL may include conductive layers and insulating layers, and the conductive layers may form the pixel circuit PXC. The pixel circuit PXC may include circuit elements capable of driving the sub-pixel SPX (or the light emitting element LD). The circuit elements may include a driving transistor, and may also include additional transistors and capacitors.

The light emitting element layer LEL may be disposed on the pixel circuit layer PCL. In some embodiments, the light emitting element layer LEL may include the light emitting element LD.

In some embodiments, the light emitting element LD may include an inorganic light emitting diode including an inorganic material or an organic light emitting diode (OLED) including an organic material. However, the disclosure is not limited thereto. For better understanding and ease of description, in the specification, an embodiment in which the light emitting element LD includes an organic light emitting diode is described.

In some embodiments, the light emitting element layer LEL may further include a pixel defining film PDL, a capping layer CPL, and an encapsulation film TFE.

In some embodiments, the light emitting element LD may be disposed on the pixel circuit layer PCL. The light emitting element LD may include a first light emitting element included in the first sub-pixel SPX1, a second light emitting element included in the second sub-pixel SPX2, and a third light emitting element included in the third sub-pixel SPX3.

In some embodiments, the light emitting element LD may include a first electrode EL1, a light emitting portion EL, and a second electrode EL2. In some embodiments, the light emitting portion EL may be disposed in an area defined by the pixel defining film PDL. A surface of the light emitting portion EL may be electrically connected to the first electrode EL1, and another surface of the light emitting portion EL may be electrically connected to the second electrode EL2.

The first electrode EL1 may be an anode electrode for the light emitting portion EL, and the second electrode EL2 may be a cathode electrode for the light emitting portion EL. In some embodiments, the first electrode EL1 and the second electrode EL2 may include a conductive material. For example, the conductive material may include at least one of gold (Au), silver (Ag), aluminum (Al), molybdenum (Mo), chromium (Cr), titanium (Ti), nickel (Ni), neodymium (Nd), copper (Cu), and platinum (Pt). In other embodiments, the conductive material may include at least one of a silver nanowire (AgNW), an indium tin oxide (ITO), an indium zinc oxide (IZO), an indium gallium zinc oxide (IGZO), an antimony zinc oxide (AZO), a zinc oxide (ZnO), a tin oxide (SnO2), a carbon nano tube, and graphene. However, the disclosure is not necessarily limited thereto.

The light emitting portion EL may emit light based on an electrical signal provided from the anode electrode (for example, the first electrode EL1) and the cathode electrode (for example, the second electrode EL2).

The light emitting portion EL may include a multi-layered structure. For example, each light emitting portion EL may include a light emitting structure including a hole transport portion, a light emitting layer (or a light generation layer), and an electron transport portion. Respective layers forming the light emitting structure may include an organic material, and in some embodiments, they may further include an inorganic material such as a metal-containing compound or quantum dot.

The hole transport portion may include a multi-layered structure having layers each containing different materials. For example, the hole transport portion may include at least one of a hole injection layer and a hole transport layer, and in some embodiments, it may further include a light emitting auxiliary layer and an electron blocking layer. For example, the hole transport portion may have a multi-layered structure such as a hole injection layer/hole transport layer, a hole injection layer/hole transport layer/light emitting auxiliary layer, a hole transport layer/light emitting auxiliary layer, an electron blocking layer/hole injection layer/hole transport layer, hole transport layers that are sequentially disposed and include different materials, or a hole injection layer/hole transport layer/electron blocking layer. However, the disclosure is not limited to specific examples.

The light emitting layer may include a material that may emit light of a color. The light emitting layer may include a host and a dopant. The host of the light emitting layer may be a light emitting material that may capture carriers (electrons and holes) for light generation, and may induce excitons to be efficiently generated. The dopant may include a phosphorescent dopant or a fluorescent dopant. In some embodiments, examples of the dopant are not particularly limited. In some embodiments, the dopant may include an organic material or a metal complex.

The electron transport portion may include a multi-layered structure having layers each containing different materials. The electron transport portion may include at least one of an electron injection layer and an electron transport layer, and in some embodiment, it may further include an electron buffer layer and a hole blocking layer. For example, the electron transport portion may have a multi-layered structure such as an electron transport layer/electron injection layer, a hole blocking layer/electron transport layer/electron injection layer, an electron control layer/electron transport layer/electron injection layer, or a buffer layer/electron transport layer/electron injection layer. However, the disclosure is not limited to specific examples.

The pixel defining film PDL may be disposed on the pixel circuit layer PCL to define a position at which the light emitting portion EL is disposed. The pixel defining film PDL may include an organic material. For example, the pixel defining film PDL may include at least one of an acrylic resin, an epoxy resin, a phenol resin, a polyamide resin, and a polyimide resin. However, the disclosure is not limited thereto. In another embodiment, the pixel defining film PDL may include an inorganic material. For example, the pixel defining film PDL may include at least one of a silicon oxide (SiOx) and a silicon nitride (SiNx). In some embodiments, the pixel defining film PDL may have a multi-layered structure in which a layer containing a silicon oxide (SiOx) and a layer containing a silicon nitride (SiNx) are stacked.

The capping layer CPL may be disposed on the second electrode EL2. The capping layer CPL may cap the second electrode EL2. The capping layer CPL may include an inorganic material.

The encapsulation film TFE may be disposed on the light emitting element LD (for example, the second electrode EL2). The encapsulation film TFE may offset a level difference generated by the light emitting element LD and the pixel defining film PDL. The encapsulation film TFE may include multiple insulating films covering the light emitting element LD. In some embodiments, the encapsulation film TFE may have a structure in which an inorganic film and an organic film are alternately stacked. In some embodiments, the encapsulation film TFE may be a thin film encapsulation film.

The light controlling layer LCL may be disposed on the display layer DL, and may include color conversion layers CCL1 and CCL2 (see FIG. 5), a light transmitting bank structure SCL (see FIG. 5), and color filters CF configured to change the wavelength of light of a color. The light controlling layer LCL may allow the display device DD to implement a full-color display structure, and may be a layer for improving light output efficiency.

Figure 6:
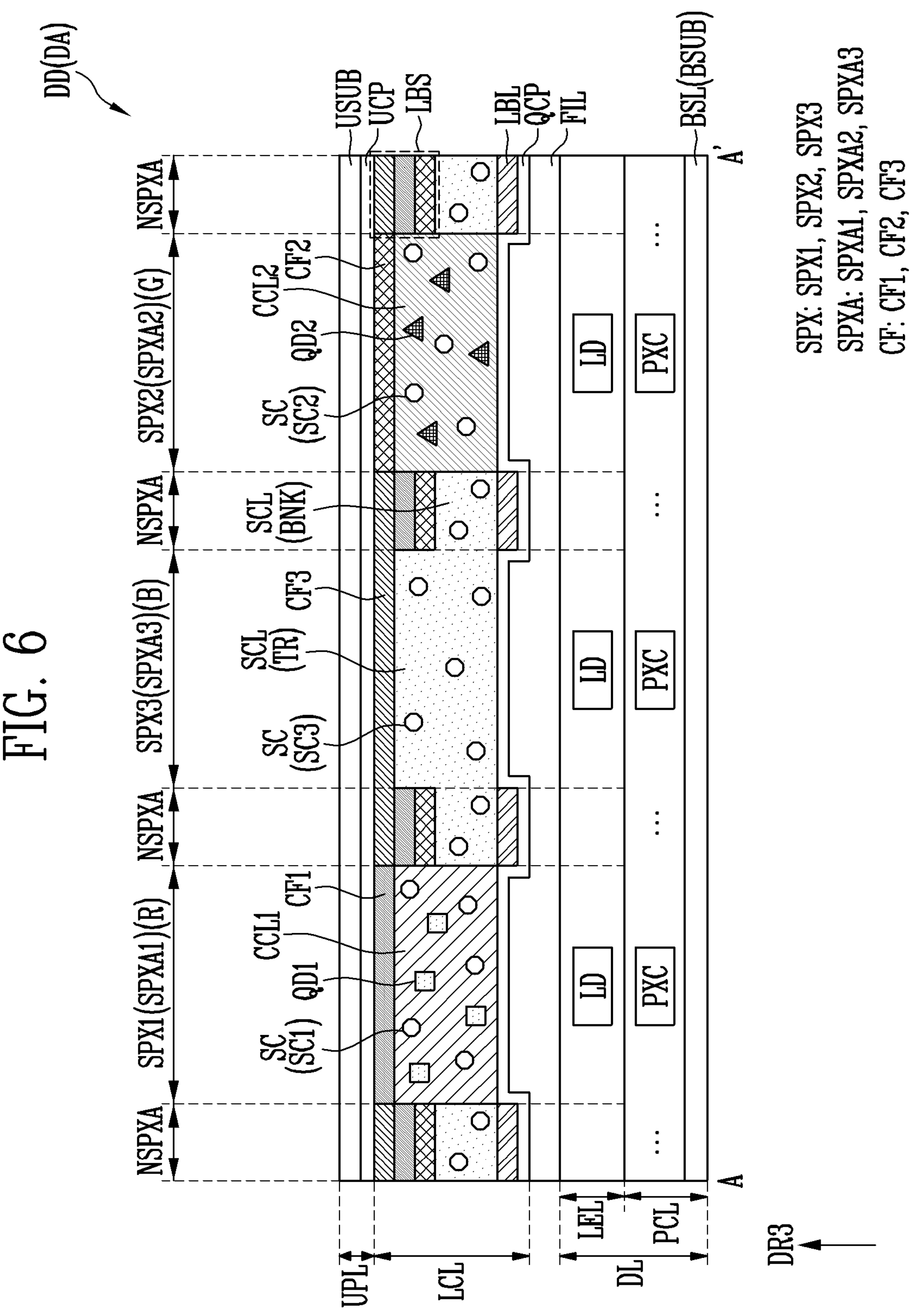
FIG. 6 illustrates a schematic cross-sectional view of a display device according to an embodiment.

The upper layer UPL may be disposed on the light controlling layer LCL and may include an upper substrate USUB (see FIG. 6). The upper layer UPL may protect the internal components of the display device DD and transmit light.

Hereinafter, a display device DD including a light controlling layer LCL according to an embodiment will be described with reference to FIG. 4 to FIG. 15. Descriptions that may be redundant to those described above are simplified or are not repeated.

Figure 4:
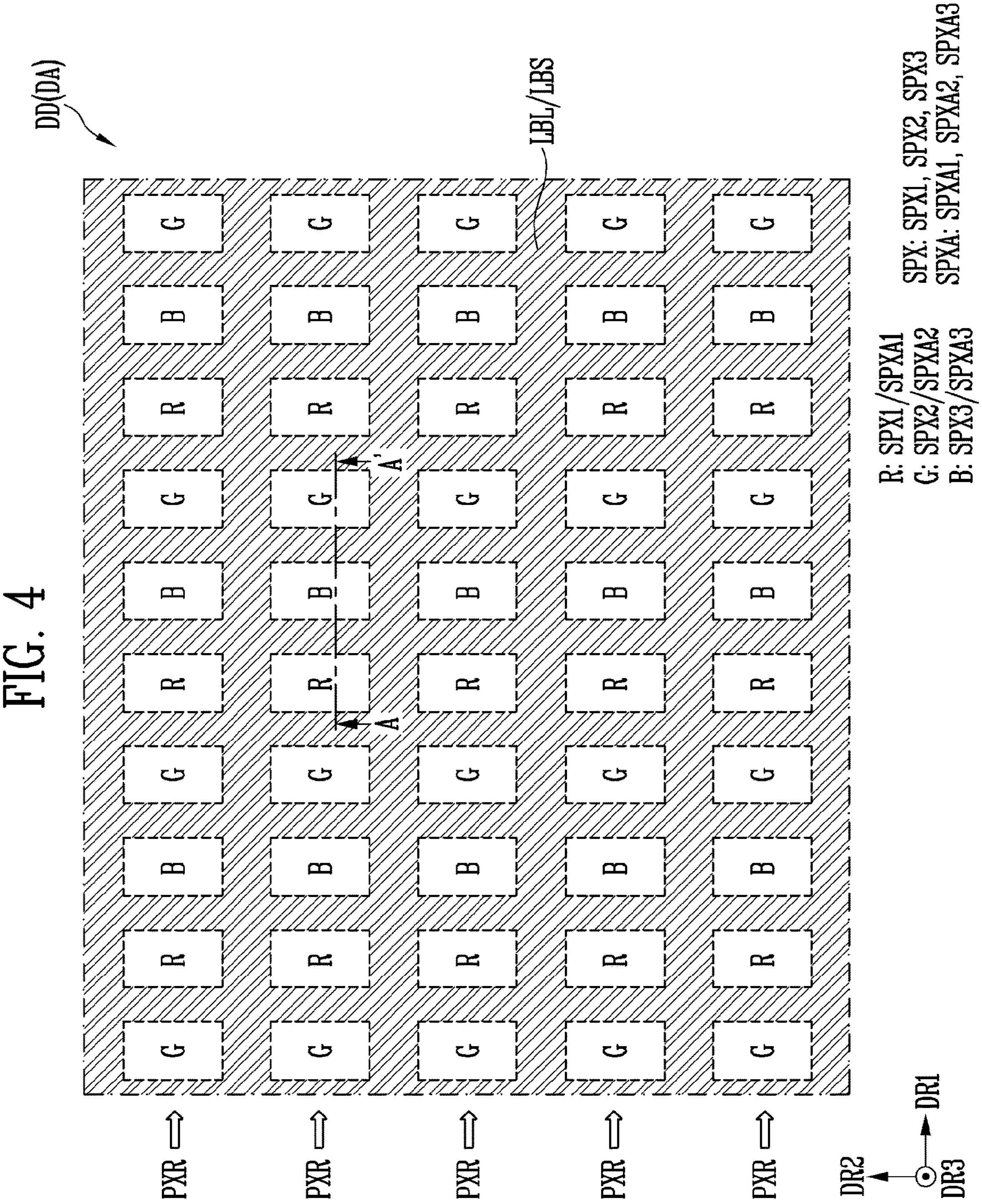
FIG. 4 and FIG. 5 illustrate schematic top plan views of a display device according to an embodiment.
Figure 5:
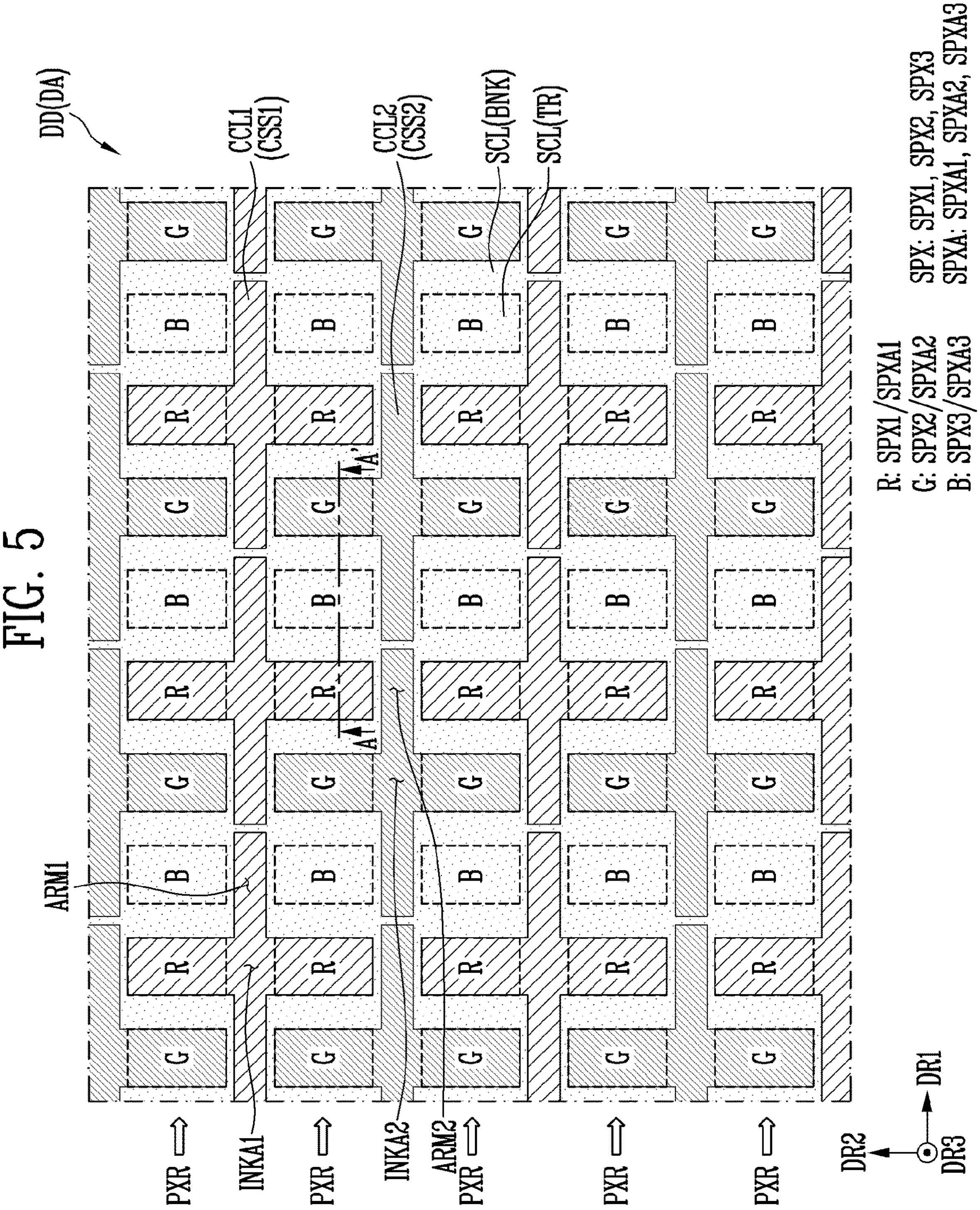

FIG. 4 and FIG. 5 illustrate schematic top plan views of a display device according to an embodiment. For better understanding and ease of description, FIG. 4 and FIG. 5 illustrate the same area within the display area DA. Accordingly, referring to FIG. 4 and FIG. 5, a positional relationship in a plan view between components will be clearly understood.

FIG. 6 illustrates a schematic cross-sectional view of a display device according to an embodiment. FIG. 6 illustrates a schematic cross-sectional view taken along line A-A' of FIG. 4 and FIG. 5. FIG. 6 schematically illustrates first to third sub-pixel areas SPXA1, SPXA2, and SPXA3 and non-sub-pixel area NSPXA. For better understanding and ease of description, FIG. 6 briefly illustrates the configurations of the display layer DL.

Figure 7:
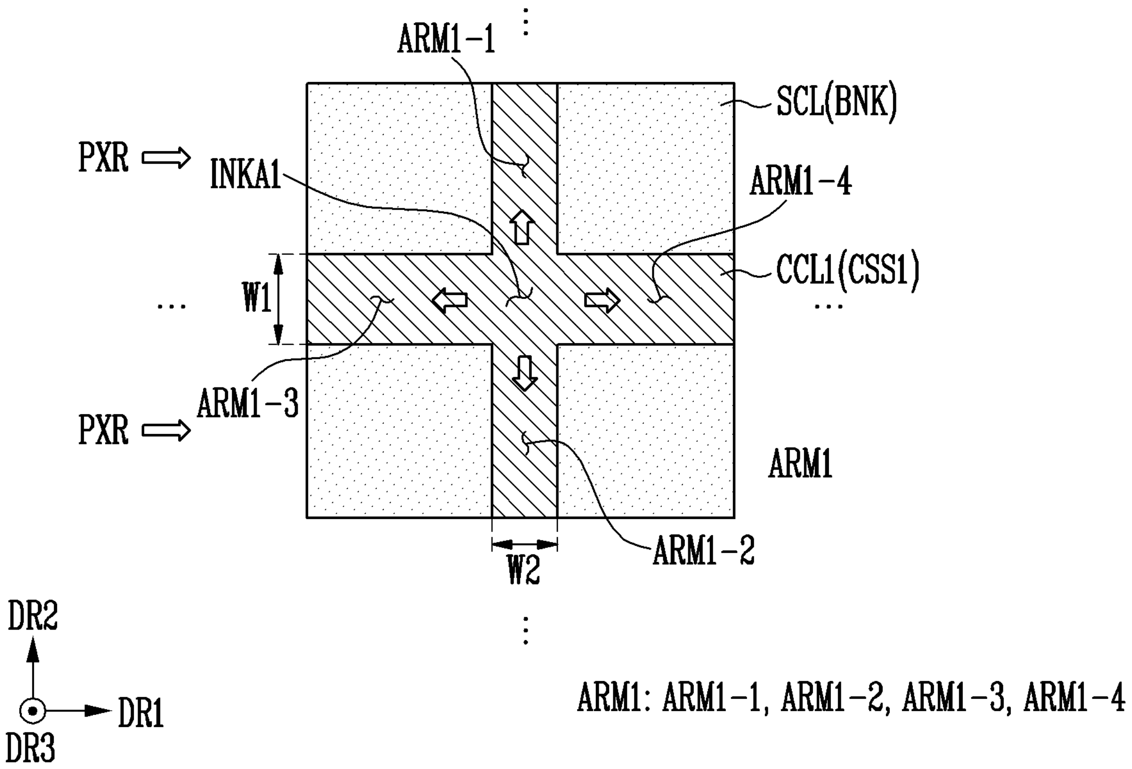
FIG. 7 illustrates a schematic top plan view of a light transmitting partition wall structure according to an embodiment and a first color conversion layer disposed adjacent thereto.
Figure 8:
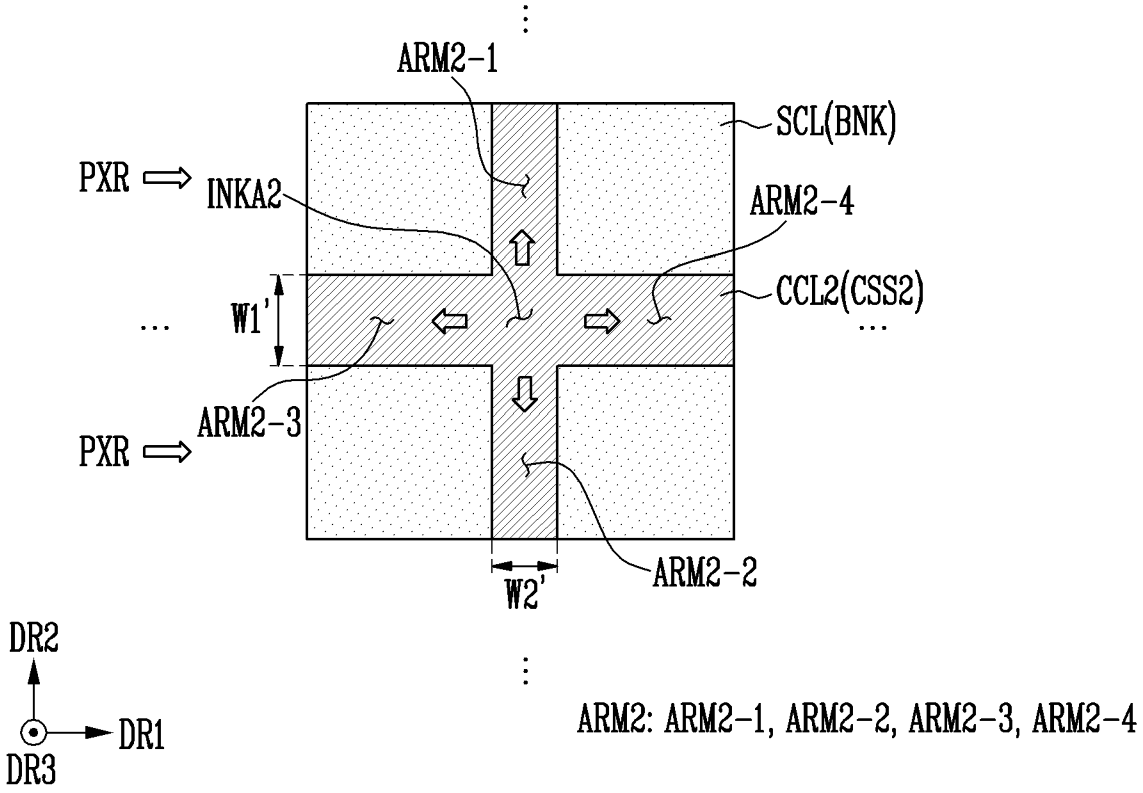
FIG. 8 illustrates a schematic top plan view of a light transmitting partition wall structure according to an embodiment and a second color conversion layer disposed adjacent thereto.

FIG. 7 illustrates a schematic top plan view of a light transmitting partition wall structure according to an embodiment and a first color conversion layer disposed adjacent thereto. FIG. 8 illustrates a schematic top plan view of a light transmitting partition wall structure according to an embodiment and a second color conversion layer disposed adjacent thereto. FIG. 7 and FIG. 8 schematically illustrate planar shapes of the first and second color conversion layers CCL1 and CCL2 defined by the shape of the light transmitting partition wall structure SCL according to an embodiment.

Figure 9:
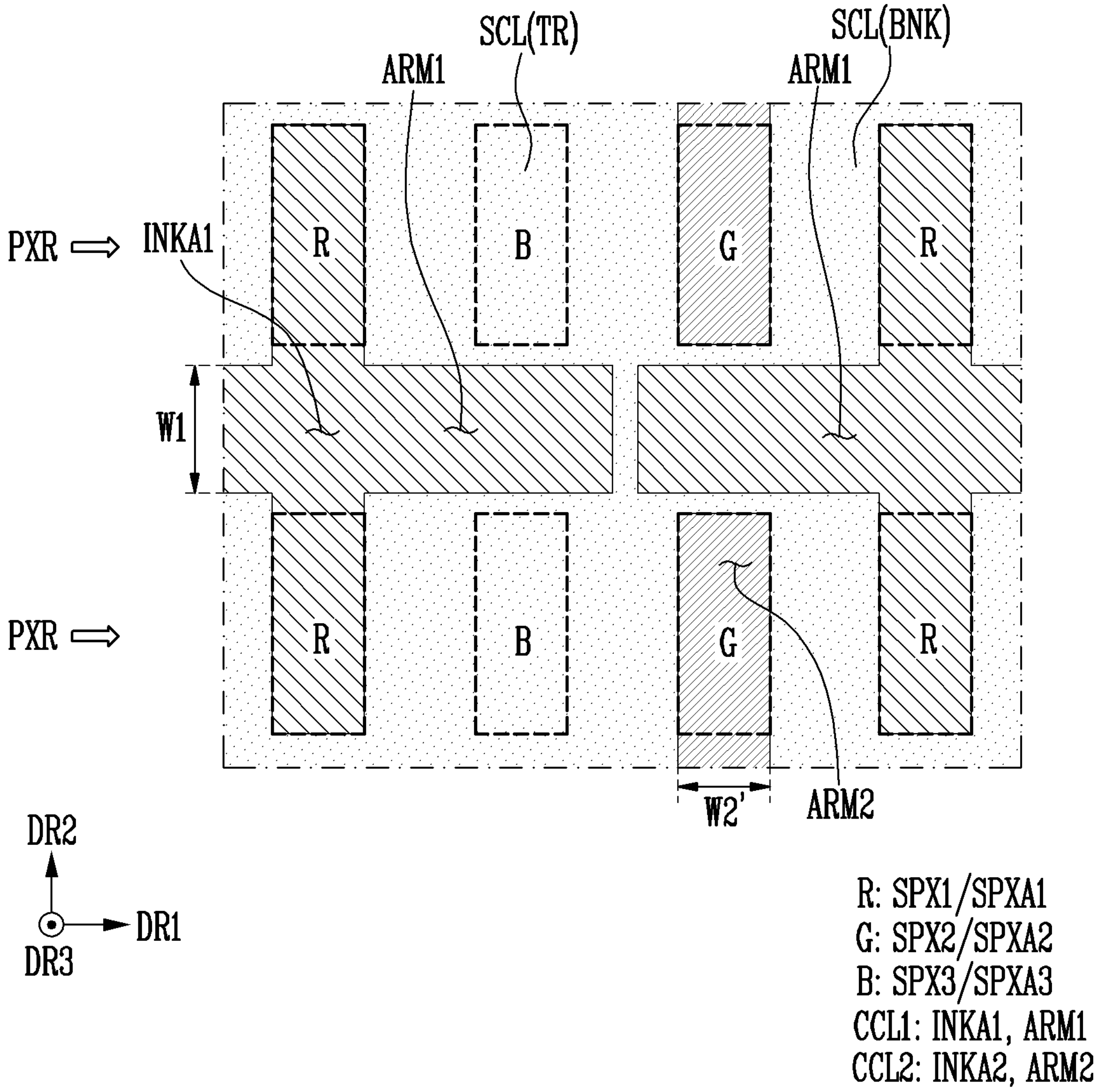
FIG. 9 illustrates a schematic top plan view of a length relationship between a first color conversion layer and a second color conversion layer adjacent to each other according to an embodiment.

FIG. 9 illustrates a schematic top plan view of a length relationship between a first color conversion layer and a second color conversion layer adjacent to each other according to an embodiment.

Figure 10:
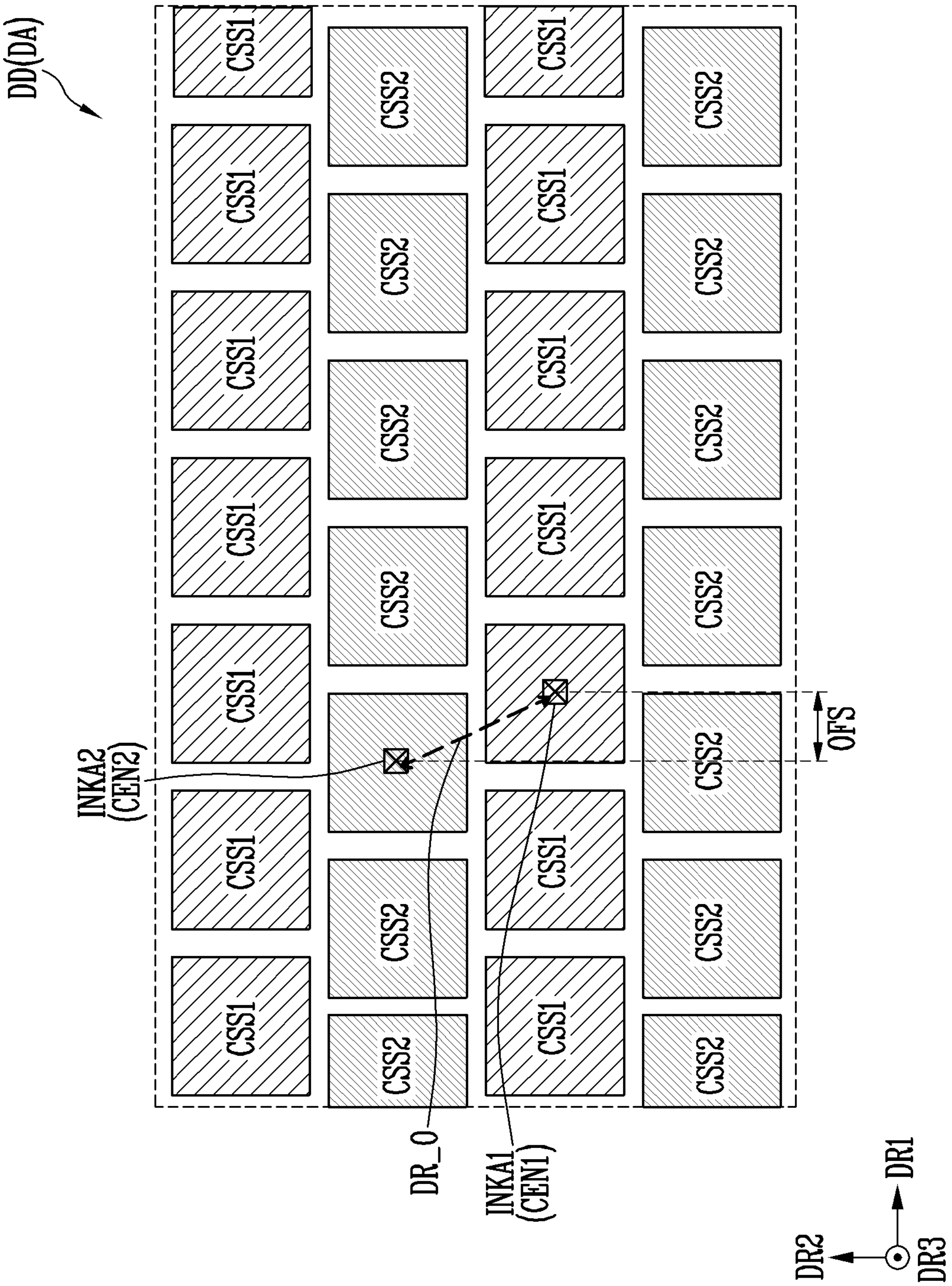
FIG. 10 illustrates a schematic top plan view of an arrangement structure of first and second cross structures defined by first and second color conversion layers according to an embodiment.
Figure 11:
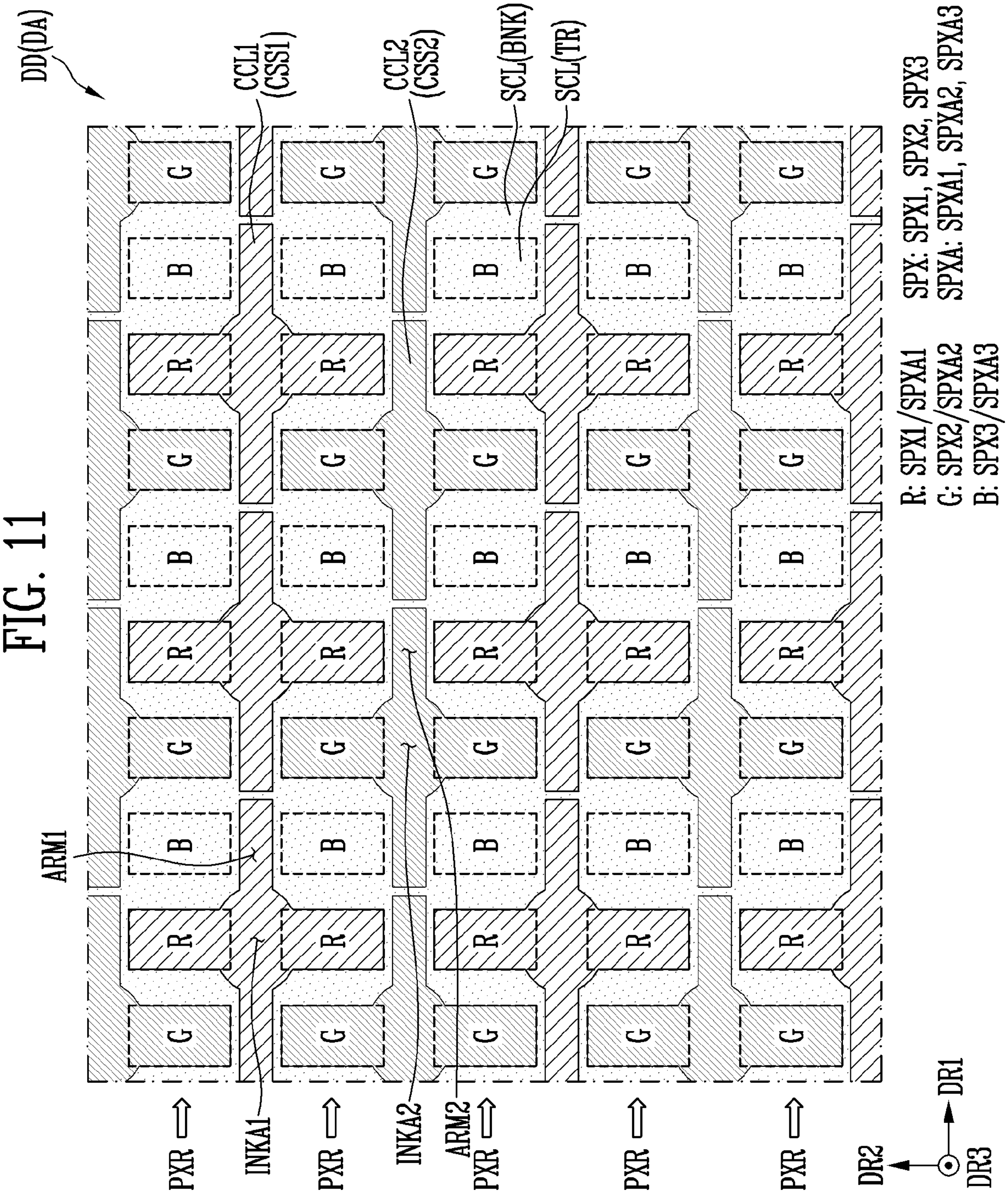
FIG. 11 to FIG. 14 illustrate schematic top plan views of a display device according to an embodiment.
Figure 12:
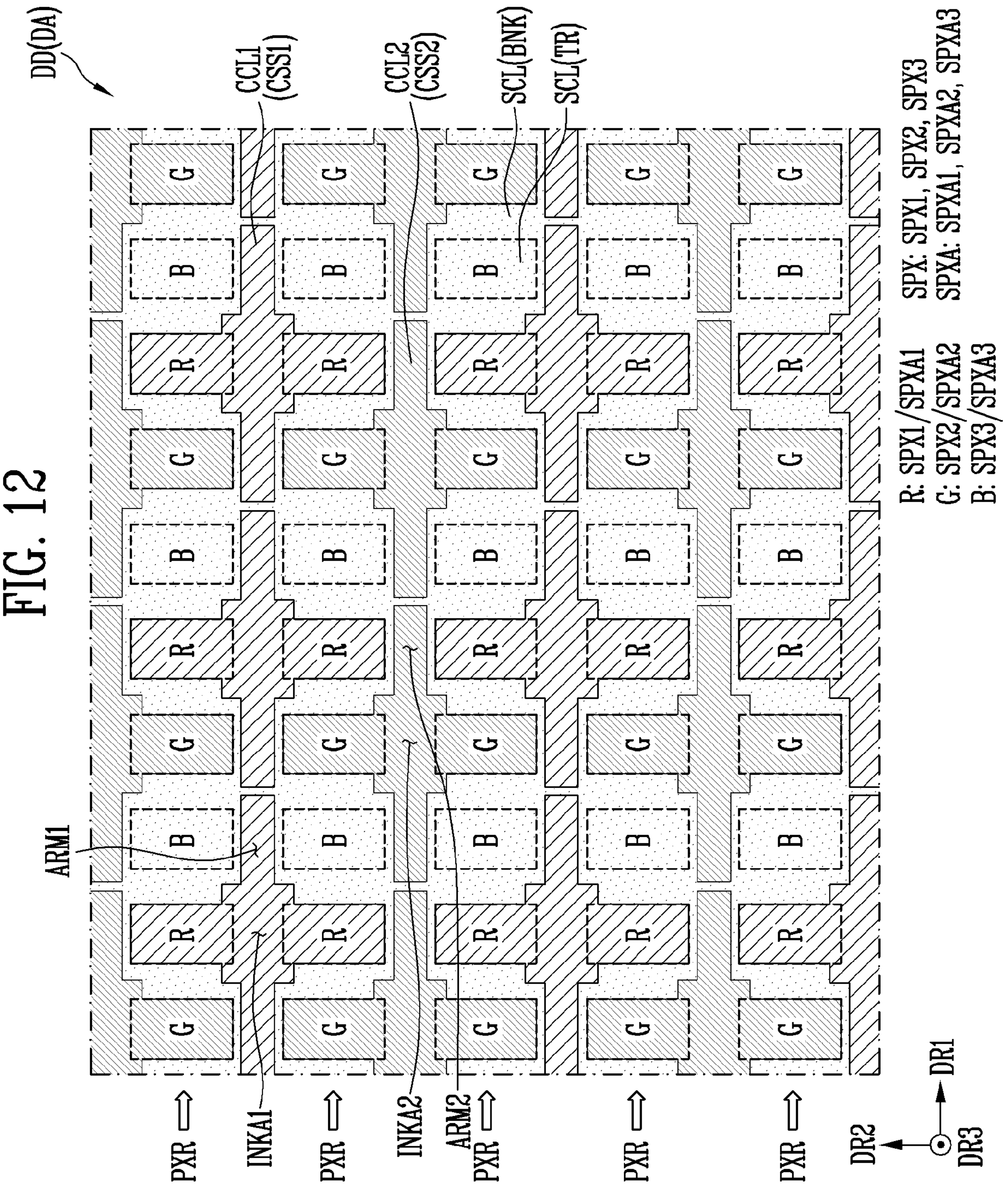
Figure 13:
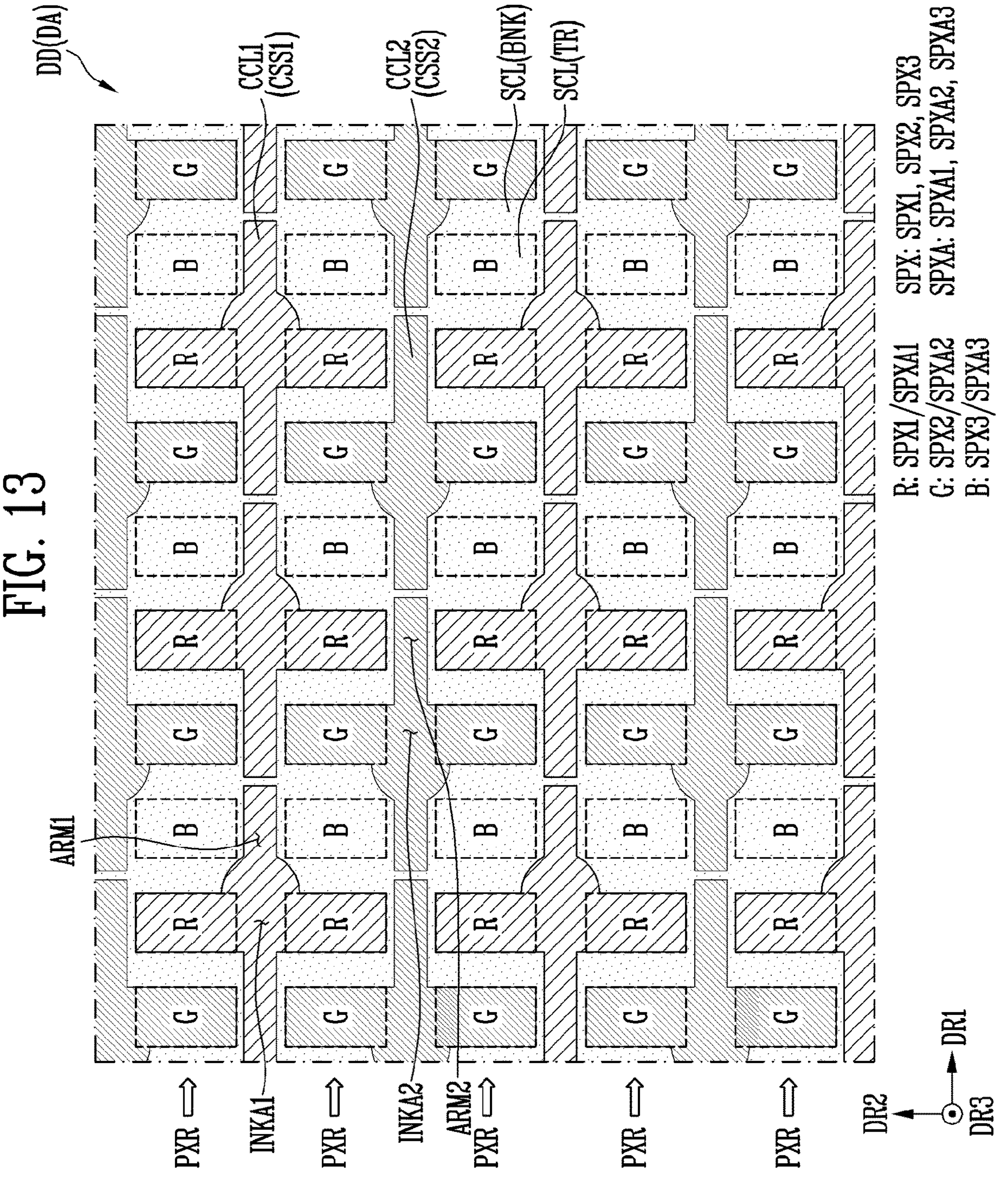

FIG. 10 illustrates a schematic top plan view of an arrangement structure of first and second cross structures defined by first and second color conversion layers according to an embodiment.

Referring to FIG. 4 to FIG. 10, each display device DD may include the sub-pixels SPX, each forming a sub-pixel area SPXA. The display device DD may further include the non-sub-pixel area NSPXA. The non-sub-pixel area NSPXA may be an area other than the sub-pixel area SPXA, and may be an area in which light of a color is not viewed.

The sub-pixel SPX may include the first sub-pixel SPX1 forming the first sub-pixel area SPXA1, the second sub-pixel SPX2 forming the second sub-pixel area SPXA2, and the third sub-pixel SPX3 forming the third sub-pixel area SPXA3.

For better understanding and ease of description, the first sub-pixel area SPXA1 (or the first sub-pixel SPX1) is represented by "R" in the drawings below. The second sub-pixel area SPXA2 is represented by "G" in the drawings below. The third sub-pixel area SPXA3 is represented by "B" in the drawings below.

The sub-pixel areas SPXA may be sequentially arranged along a first direction DR1. In some embodiments, the sub-pixel areas SPXA corresponding to different colors may not be directly adjacent to each other in the display area DA. For example, the first sub-pixel area SPXA1, the third sub-pixel area SPXA3, and the second sub-pixel area SPXA2 may be sequentially arranged along the first direction DR1. Accordingly, the pixels PXL defined by the first to third sub-pixels SPX1 to SPX3 may be arranged along the first direction DR1.

The sub-pixel areas SPXA may be sequentially arranged along a second direction DR2. In some embodiments, the sub-pixel areas SPXA corresponding to different colors may be directly adjacent to each other in the display area DA. For example, the first sub-pixel areas SPXA1, the third sub-pixel areas SPXA3, and the second sub-pixel areas SPXA2 may be sequentially arranged along the second direction DR2, respectively. Accordingly, the sub-pixels SPX for the same color of each of the different pixels PXL adjacent to each other in the second direction DR2 may be adjacent along the second direction DR2.

The sub-pixel areas SPXA may be surrounded by a light blocking layer LBL in a plan view. For example, in some embodiments, the light blocking layer LBL may overlap the non-sub-pixel area NSPXA in a plan view.

A plane may be defined by a direction extending in the first direction DR1 and the second direction DR2, and may be defined based on a plane on which the base layer BSL is disposed. In some embodiments, a third direction DR3 may be a thickness direction of the base layer BSL, and the third direction DR3 may be a light emitting direction of the display device DD.

The sub-pixel areas SPXA may be surrounded by a light blocking structure LBS in a plan view. For example, in some embodiments, the light blocking structure LBS may overlap the non-sub-pixel area NSPXA in a plan view.

In some embodiments, the first sub-pixel area SPXA1 may overlap a portion of the first color conversion layer CCL1 in a plan view.

For example, the first color conversion layer CCL1 may include a first central area INKA1 and a first arm area ARM1.

The first central area INKA1 may be disposed in the non-sub-pixel area NSPXA. The first central area INKA1 may be directly adjacent to two or more first arm areas ARM1. The first central area INKA1 may not overlap the sub-pixel areas SPXA in a plan view.

The first central area INKA1 may be disposed between pixel rows PXR that respectively extend in the first direction DR1 and are adjacent to each other in the second direction DR2. The pixel rows PXR may be adjacent to each other in the second direction DR2 and may extend in the first direction DR1.

The first central area INKA1 may overlap a portion of the first arm area ARM1 and another first central area INKA1 along the first direction DR1. The first central area INKA1 may overlap a portion of the first arm area ARM1 and another first central area INKA1 along the second direction DR2. The first central area INKA1 may overlap the first sub-pixel area SPXA1 along the second direction DR2.

The first central area INKA1 may include an area to which a first ink is supplied, including a material for forming the first color conversion layer CCL1, during an inkjet process for manufacturing the first color conversion layer CCL1. For example, the first ink provided in the first central area INKA1 may be provided in each of the first arm areas ARM1 extending in two or more directions.

The first arm area ARM1 may include first arm areas ARM1 each extending in two or more different directions. For example, the first color conversion layer CCL1 may form a first cross structure CSS1 having a substantially cross shape in a plan view. For example, the first arm area ARM1 may include, based on the first central area INKA1 in a plan view, a (1-1)-th arm area ARM1-1 extending upward, a (1-2)-th arm area ARM1-2 extending downward, a (1-3)-th arm area ARM1-3 extending left, and a (1-4)-th arm area ARM1-4 extending right.

Accordingly, in case that the first ink is supplied to the first central area INKA1, the first ink may be diffused into the (1-1)-th arm area ARM1-1, the (1-2)-th arm area ARM1-2, the (1-3)-th arm area ARM1-3, and the (1-4)-th arm area ARM1-4.

The (1-1)-th arm area ARM1-1 may be a portion of the first color conversion layer CCL1 included in the pixel row PXR formed on the first side of the first central area INKA1, and may be disposed in the first sub-pixel area SPXA1. The (1-2)-th arm area ARM1-2 may be a portion of the first color conversion layer CCL1 included in the pixel row PXR formed on the second side of the first central area INKA1, and may be disposed in the first sub-pixel area SPXA1. In addition, the (1-3)-th arm area ARM1-3 and the (1-4)-th arm area ARM1-4 may be disposed in the non-sub-pixel area NSPXA.

That is, in some embodiments, in case that an inkjet process for forming the first color conversion layer CCL1 is performed, the inkjet process may be performed on two or more pixel rows PXR even in case that the first ink is supplied to a position. Accordingly, process performance may be improved and process steps may be simplified, so process costs may be reduced.

In some embodiments, the first arm area ARM1 may have a width. For example, a portion of the first arm area ARM1 extending in the first direction DR1 may have a first width W1. The (1-3)-th arm area ARM1-3 and the (1-4)-th arm area ARM1-4 may have the first width W1. For example, a portion of the first arm area ARM1 extending in the second direction DR2 may have a second width W2. The (1-1)-th arm area ARM1-1 and the (1-2)-th arm area ARM1-2 may have the second width W2.

According to an embodiment, the first width W1 and the second width W2 may be different from each other. For example, the first width W1 may be larger than the second width W2. In this case, in case that ink is provided in the first central area INKA1, a tendency for ink to diffuse along the first direction DR1 may be greater than a tendency for ink to diffuse along the second direction DR2.

In some embodiments, the second sub-pixel area SPXA2 may overlap a portion of the second color conversion layer CCL2 in a plan view.

For example, the second color conversion layer CCL2 may include a second central area INKA2 and a second arm area ARM2.

The second central area INKA2 may be disposed in the non-sub-pixel area NSPXA. The second central area INKA2 may be directly adjacent to two or more second arm areas ARM2. The second central area INKA2 may not overlap the sub-pixel areas SPXA in a plan view.

The second central area INKA2 may be disposed between pixel rows PXR that respectively extend in the first direction DR1 and are adjacent to each other in the second direction DR2.

The second central area INKA2 may overlap a portion of the second arm area ARM2 and another second central area INKA2 along the first direction DR1. The second central area INKA2 may overlap a portion of the second arm area ARM2 and another second central area INKA2 along the second direction DR2. The second central area INKA2 may overlap the second sub-pixel area SPXA2 along the second direction DR2.

The second central area INKA2 may include an area to which a second ink including a material for forming the second color conversion layer CCL2 is supplied, during an inkjet process for manufacturing the second color conversion layer CCL2. For example, the second ink provided in the second central area INKA2 may be provided in each of the second arm areas ARM2 extending in two or more directions.

The second arm area ARM2 may include second arm areas ARM2 each extending in two or more different directions. For example, the second color conversion layer CCL2 may form a second cross structure CSS2 having a substantially cross shape in a plan view. For example, the second arm area ARM2 may include, based on the second central area INKA2 in a plan view, a (2-1)-th arm area ARM2-1 extending upward, a (2-2)-th arm area ARM2-2 extending downward, a (2-3)-th arm area ARM2-3 extending left, and a (2-4)-th arm area ARM2-4 extending right.

Accordingly, in case that the second ink is supplied to the second central area INKA2, the second ink may be diffused into the (2-1)-th arm area ARM2-1, the (2-2)-th arm area ARM2-2, the (2-3)-th arm area ARM2-3, and the (2-4)-th arm area ARM2-4.

The (2-1)-th arm area ARM2-1 may be a portion of the second color conversion layer CCL2 included in the pixel row PXR formed on the first side of the second central area INKA2, and may be disposed in the second sub-pixel area SPXA2. The (2-2)-th arm area ARM2-2 may be a portion of the second color conversion layer CCL2 included in the pixel row PXR formed on the second side of the second central area INKA2, and may be disposed in the second sub-pixel area SPXA2. In addition, the (2-3)-th arm area ARM2-3 and the (2-4)-th arm area ARM2-4 may be disposed in the non-sub-pixel area NSPXA.

That is, in some embodiments, in case that an inkjet process for forming the second color conversion layer CCL2 is performed, the inkjet process may be performed on two or more pixel rows PXR even in case that the second ink is supplied to a position. Accordingly, process performance may be improved and process steps may be simplified, so process costs may be reduced.

In some embodiments, the second arm area ARM2 may have a width. For example, a portion of the second arm area ARM2 extending in the first direction DR1 may have a first width W1'. The (2-3)-th arm area ARM2-3 and the (2-4)-th arm area ARM2-4 may have the second width W1'. For example, a portion of the second arm area ARM2 extending in the second direction DR1 may have a second width W2'. The (2-1)-th arm area ARM2-1 and the (2-2)-th arm area ARM2-2 may have the second width W2'.

In some embodiments, the first width W1' and the second width W2' may be different from each other. For example, the first width W1' may be larger than the second width W2'. In case that ink is provided in the second central area INKA2, a tendency for ink to diffuse along the first direction DR1 may be greater than a tendency for ink to diffuse along the second direction DR2.

Referring to FIG. 9, the first width W1 defined in the first color conversion layer CCL1 may be larger than the second width W2' defined in the second color conversion layer CCL2. Similarly, the first width W1' defined in the second color conversion layer CCL2 may be larger than the second width W2 defined in the second color conversion layer CCL2.

As described above, inks may be provided in an opening OPN (see FIG. 21) formed by a bank BNK of the light transmitting partition wall structure SCL, respectively, so that the first and second color conversion layers CCL1 and CCL2 may be provided. According to an embodiment, since the first and second color conversion layers CCL1 and CCL2 satisfy the width relationship described above, a risk of a ink diffusing to an unintended area may be prevented. Accordingly, an ink material may be efficiently utilized and process convenience may be improved.

For example, the first color conversion layers CCL1 may be adjacent in the first direction DR1 so that the areas in which the first width W1 is defined face each other, and may be adjacent to the second color conversion layer CCL2 in the second direction DR2 so as to be adjacent to the area in which the second width W2 of the second color conversion layer CCL2 is defined. In this case, the risk that the ink supplied to the first central area INKA1 and the first arm area ARM1 to manufacture the first color conversion layer CCL1 may diffuse into the area for providing the second color conversion layer CCL2 may be reduced.

Similarly, the second color conversion layers CCL2 may be adjacent in the first direction DR1 so that the areas in which the second width W2' is defined face each other, and may be adjacent to the first color conversion layer CCL1 in the second direction DR2 so as to be adjacent to the area in which the first width W1 of the first color conversion layer CCL1 is defined. In this case, the risk that the ink supplied to the second central area INKA2 and the second arm area ARM2 to manufacture the second color conversion layer CCL2 may diffuse into the area for providing the first color conversion layer CCL1 may be reduced.

Referring to FIG. 10, in some embodiments, the first and second cross structures CCS1 and CCS2 formed by the first and second color conversion layers CCL1 and CCL2 may be disposed to deviate from each other in a direction.

For better understanding and ease of description, FIG. 10 illustrates the positional relationship between the first and second cross structures CCS1 and CCS2, and the illustration of other components other than the first and second cross structures CCS1 and CCS2 are omitted. In addition, since the first and second cross structures CCS1 and CCS2 may include the arm areas ARM1 and ARM2, respectively, it will be clearly understood in connection with the drawings described above that the first arm area ARM1 is disposed between the first cross structures CSS1 and the second arm area ARM2 is disposed between the second cross structures CSS2.

The first and second cross structures CSS1 and CSS2 may be arranged in a matrix structure with respect to the first direction DR1 and the second direction DR2, respectively.

The first and second cross structures CSS1 and CSS2 may be sequentially disposed along the first direction DR1, respectively. For example, each of the first cross structures CSS1 may include the first central area INKA1, and the first central areas INKA1 may be sequentially disposed along the first direction DR1. Each of the second cross structures CSS2 may include the second central area INKA2, and the second central areas INKA2 may be sequentially disposed along the second direction DR2. The first central areas INKA1 may be adjacent to each other along the second direction DR2 with the second central area INKA2 therebetween. The second central areas INKA2 may be adjacent to each other along the second direction DR2 with the first central area INKA1 therebetween.

In some embodiments, the first and second cross structures CCS1 and CCS2 adjacent to each other may be adjacent to each other in a diagonal direction DR_0 that is different from the first direction DR1 and the second direction DR2. For example, the first central area INKA1 may include a first central portion CEN1 of the first cross structure CSS1. The second central area INKA2 may include a second central portion CEN2 of the second cross structure CSS2. In FIG. 10, the first central portion CEN1 and the second central portion CEN2 are shown in a quadrangular shape including an X mark.

A virtual line connecting the first central portion CEN1 and the second central portion CEN2 may extend in the diagonal direction DR_0. In some embodiments, the first central portion CEN1 and the second central portion CEN2 may form an offset OFS with respect to the first direction DR1. For example, the first central portion CEN1 and the second central portion CEN2 may not overlap each other along the second direction DR2, and may be spaced apart by a length corresponding to the offset OFS along the first direction DR1.

According to the structure in which the first and second cross structures CSS1 and CSS2 are offset from each other according to an embodiment, as described above, ink may be supplied to the first and second central areas INKA1 and INKA2, so that first and second color conversion layers CCL1 and CCL2 may be manufactured, and even in case that a single inkjet process is performed, the first and second color conversion layers CCL1 and CCL2 may be formed in each of the different pixel rows PXR.

In addition, according to the structure according to an embodiment, an area for performing the inkjet process is efficiently formed, so that the range of the non-light emitting area may be reduced. Accordingly, the sub-pixel areas SPXA may be further expanded.

The third sub-pixel area SPXA3 and the non-sub-pixel area NSPXA may overlap the light transmitting partition wall structure SCL in a plan view.

For example, the light transmitting partition wall structure SCL may include a light transmitting layer TR disposed in the third sub-pixel area SPXA3 and a bank BNK disposed in the non-sub-pixel area NSPXA.

The light transmitting layer TR and the bank BNK may be integrally formed. The light transmitting layer TR and the bank BNK may be patterned within a same process. The light transmitting layer TR and the bank BNK may be patterned based on a photolithography process.

The light transmitting layer TR and the bank BNK may include a same light transmitting material. For example, the light transmitting layer TR and the bank BNK may include an organic material (for example, a transparent organic material) and a scatterer SC (see FIG. 6). For example, the organic material may include at least one of an acrylic resin, an epoxy resin, a phenol resin, a polyamide resin, and a polyimide resin. The scatterer SC may include various light scattering particles. For example, the scatterer SC may include at least one of a titanium oxide (TiOx), a silica (SiOx) (for example, a silica bead, a hollow silica, or the like), a zirconium oxide (ZrOx), an aluminum oxide (AlxOy), an indium oxide (InxOy), a zinc oxide (ZnOx), a tin oxide (SnOx), and an antimony oxide (SbxOy). However, the disclosure is not limited thereto.

The light transmitting partition wall structure SCL may form the opening OPN. For example, the opening OPN formed by the light transmitting partition wall structure SCL may include a first central opening area INKA1_O, a first arm opening area ARM1_O, a second central opening area INKA2_0, and a second arm opening area ARM2_O.

At least a portion of the light transmitting partition wall structure SCL may not overlap the light blocking layer LBL and the light blocking structure LBS in a plan view, and accordingly, the light transmitting layer TR corresponding to the third sub-pixel area SPXA3 may be formed.

At least a portion of the light transmitting partition wall structure SCL forms an opening to form an area in which the first and second color conversion layers CCL1 and CCL2 may be supplied, and accordingly, the bank BNK forming a space in which ink may be accommodated during an inkjet process may be formed.

Accordingly, the light transmitting partition wall structure SCL may be directly adjacent to the first and second color conversion layers CCL1 and CCL2.

In some embodiments, the opening OPN formed by the light transmitting partition wall structure SCL may include multiple openings OPN spaced apart from each other, and each of the openings OPN may correspond to the shape of the first and second color conversion layers CCL1 and CCL2. For example, each of the openings OPN may correspond to the shape of the first and second cross structures CSS1 and CSS2.

According to an embodiment, the display layer DL may include the pixel circuit PXC disposed on the base layer BSL (for example, the lower substrate BSUB) and the light emitting element LD electrically connected to the pixel circuit PXC.

In some embodiments, the display layer DL may be prepared by manufacturing the pixel circuit layer PCL by patterning the pixel circuit PXC on the lower substrate BSUB and by manufacturing the light emitting element layer LEL by disposing the light emitting element LD on the pixel circuit layer PCL. For example, the first display layer DL may be manufactured as a first panel.

In some embodiments, the upper layer UPL and the light controlling layer LCL may be prepared by disposing components for forming the upper layer UPL and the light controlling layer LCL on the upper substrate BSUB. For example, the upper layer UPL and the light controlling layer LCL may be manufactured as a second panel.

After the first panel and the second panel are manufactured, a filling layer FIL may be disposed between the first panel and the second panel, so that the display device DD according to an embodiment may be manufactured.

That is, the display device DD according to an embodiment may be manufactured by combining panels prepared by disposing layers on separate substrates. However, the disclosure is not limited thereto. For example, layers forming the display device DD may be sequentially disposed on a single substrate to manufacture the display device DD, and in some embodiments, separate panels may be manufactured, but unlike FIG. 6, the light controlling layer LCL may be manufactured using the lower substrate BSUB as a manufacturing substrate.

For better understanding and ease of description, in the specification, an embodiment in which the display layer DL is manufactured based on the lower substrate BSUB and the upper layer UPL and the light controlling layer LCL are manufactured based on the upper substrate USUB will be described.

In some embodiments, the light emitting elements LD may be disposed in each of the sub-pixel areas SPXA, and may be electrically connected to the corresponding pixel circuit PXC.

The light emitting elements LD may emit light of a color. In some embodiments, the light emitting elements LD may emit light of a same color in the first to third sub-pixel areas SPXA1 to SPXA3. For example, each of the light emitting elements LD may emit light of the third color (or a mixture of light of the third and second colors). In the sub-pixel areas SPXA, the light emitting elements LD emit light of the same color, but the light controlling layer LCL is provided on the light emitting element layer LEL, so that the display device DD capable of providing a full-color may be provided.

The filling layer FIL may be disposed between the light emitting element layer LEL and the light controlling layer LCL. The filling layer FIL is a layer for coupling the first panel and the second panel, and may include various transparent organic materials, and an example thereof is not particularly limited.

The light controlling layer LCL may be disposed between the upper layer UPL and the light emitting element layer LEL.

The light controlling layer LCL may include a capping layer QCP, a light blocking layer LBL, a light transmitting bank structure SCL, a first color conversion layer CCL1, a second color conversion layer CCL2, and color filters CF.

The capping layer QCP may be disposed across the first to third sub-pixel areas SPXA1 to SPXA3. The capping layer QCP may passivate the first and second color conversion layers CCL1 and CCL2, the light transmitting layer TR, and the light blocking layer LBL.

The capping layer QCP is an inorganic layer, and may include at least one of a silicon nitride (SiNx), an aluminum nitride (AlNx), a titanium nitride (TiNx), a silicon oxide (SiOx), an aluminum oxide (AlxOy), a titanium oxide (TiOx), a silicon oxycarbide (SiOxCy), and a silicon oxynitride (SiOxNy). However, the disclosure is not limited thereto.

The light blocking layer LBL may be disposed on the bank BNK. The light blocking layer LBL may be disposed in the non-sub-pixel area NSPXA. The light blocking layer LBL may be disposed between adjacent sub-pixel areas SPXA. The light blocking layer LBL may prevent color mixing between adjacent sub-pixels SPXA.

The light blocking layer LBL may include a dye or pigment that may block or absorb light. For example, the light blocking layer LBL may include carbon black or the like. However, the disclosure is not limited thereto.

In some embodiments, the light blocking layer LBL may not be disposed on the display layer DL. For example, the formation of the light blocking layer LBL in the display device DD may be omitted. Even in this case, the light blocking structure LBS according to an embodiment may be disposed adjacent to the upper layer UPL, and thus the risk of color mixing between adjacent sub-pixels SPXA may be prevented.

The bank BNK, which is a portion of the light transmitting bank structure SCL, may be disposed on a lower portion of the light blocking structure LBS. The bank BNK may be disposed on an upper portion of the light blocking layer LBL.

The banks BNK may be disposed between adjacent sub-pixel areas SPXA. In a plan view, the bank BNK may overlap the non-sub-pixel area NSPXA.

The bank BNK may surround the first and second color conversion layers CCL1 and CCL2. The bank BNK may protrude in the thickness direction (for example, the third direction DR3) of the lower substrate BSUB (for example, the base layer BSL). Accordingly, the bank BNK may form a space in which the first and second color conversion layers CCL1 and CCL2 may be disposed (for example, accommodated).

The bank BNK may be integrally formed with the light transmitting layer TR and may include the scatterer SC like the light transmitting layer TR.

The light transmitting layer TR, which is another portion of the light transmitting bank structure SCL, may be disposed below the third color filter CF3. For example, the light transmitting layer TR may be adjacent to the light blocking structure LBS and the bank BNK in the planar direction, and may overlap the third color filter CF3 in a plan view.

The light transmitting layer TR may be disposed in the third sub-pixel area SPXA3. The light transmitting layer TR may not overlap the first and second sub-pixel areas SPXA1 and SPXA2.

The light transmitting layer TR may be a layer provided to improve light output efficiency (for example, luminance) and improve viewing angle characteristics. For example, as described above, the light transmitting layer TR may include the scatterer SC, light emitted by the light emitting element LD may be scattered by the scatterer SC, and the light output efficiency and viewing angle characteristics may be improved.

The scatterer SC disposed in the third sub-pixel area SPXA3 may be the third scatterer SC3.

The first color conversion layer CCL1 may be disposed below the first color filter CF1. For example, the first color conversion layer CCL1 may be adjacent to the light blocking structure LBS and the bank BNK in the planar direction, and may overlap the first color filter CF1 in a plan view.

The first color conversion layer CCL1 may be configured to form the first sub-pixel SPX1. For example, the first color conversion layer CCL1 may include first color conversion particles that convert light (for example, light including a light component of the third color) provided from the light emitting element LD into the first color. For example, the first color conversion layer CCL1 may include a first quantum-dot QD1 that converts light of the third color into light of the first color. The first quantum-dot QD1 may absorb light of the third color and shift the wavelength according to energy transition to emit light of the first color. A second quantum-dot QD2 may be dispersed and prepared within a matrix layer of an organic material and the like.

In some embodiments, the first color conversion layer CCL1 may further include the scatterer SC. For example, the scatterer SC may be disposed in the first sub-pixel area SPXA1 to improve light output efficiency and viewing angle characteristic for the first sub-pixel SPX1.

The scatterer SC disposed in the first sub-pixel area SPXA1 may be the first scatterer SC1.

The second color conversion layer CCL2 may be disposed below the second color filter CF2. For example, the second color conversion layer CCL2 may be adjacent to the light blocking structure LBS and the bank BNK in the planar direction, and may overlap the second color filter CF2 in a plan view.

The second color conversion layer CCL2 may be configured to form the second sub-pixel SPX2. For example, the second color conversion layer CCL2 may include second color conversion particles that convert light (for example, light including a light component of the third color) provided from the light emitting element LD into the second color. For example, the second color conversion layer CCL2 may include a second quantum-dot QD2 that converts light of the third color into light of the second color. The second quantum-dot QD2 may absorb light of the third color and shift the wavelength according to energy transition to emit light of the second color. The second quantum-dot QD2 may be dispersed and prepared within a matrix layer of an organic material and the like.

In some embodiments, the second color conversion layer CCL2 may further include the scatterer SC. For example, the scatterer SC may be disposed in the second sub-pixel area SPXA2 to improve light output efficiency and viewing angle characteristic for the second sub-pixel SPX2.

The scatterer SC disposed in the second sub-pixel area SPXA2 may be the second scatterer SC2.

The color filter CF may include a first color filter CF1 disposed in the first sub-pixel area SPXA1, a second color filter CF2 disposed in the second sub-pixel area SPXA2, and a third color filter CF3 disposed in the third sub-pixel area SPXA3.

In the first sub-pixel area SPXA1, light that transmits through the first color conversion layer CCL1 to be provided as light of the first color transmits through the first color filter CF1 to be provided as light of the first color. Accordingly, the first sub-pixel SPX1 may be configured to provide light of the first color. The first color filter CF1 may include a dye or pigment that selectively transmits light of the first color.

In the second sub-pixel area SPXA2, light that transmits through the second color conversion layer CCL2 to be provided as light of the second color transmits through the second color filter CF2 to be provided as light of the first color. Accordingly, the second sub-pixel SPX2 may be configured to provide light of the second color. The second color filter CF2 may include a dye or pigment that selectively transmits light of the second color.

In the third sub-pixel area SPXA3, the light emitted by the light emitting element LD may transmit through the light transmitting layer TR to be provided as light of the same color as the emitted light. In addition, the light transmitting through the light transmitting layer TR to be provided as light of the same color as the emitted light may transmit through the third color filter CF3 to be provided as light of the third color. Accordingly, the third sub-pixel SPX3 may be configured to provide light of the third color. The third color filter CF3 may include a dye or pigment that selectively transmits light of the third color.

The upper layer UPL may be disposed on the light controlling layer LCL. The upper layer UPL may include the upper substrate USUB and the upper capping layer UCP.

The upper substrate USUB may be a manufacturing substrate for manufacturing a second panel including the light controlling layer LCL and the upper layer UPL, and may include one of the materials described above with reference to the lower substrate BSUB (for example, the base layer BSL). For example, the upper substrate USUB may include an organic substrate.

The upper capping layer UCP may be disposed between the upper substrate USUB and the color filters CF, and may passivate the upper substrate USUB. The upper capping layer UCP may include at least one of the examples described above with reference to the capping layer QCP.

However, the disclosure is not limited thereto. For example, the upper layer UPL may include an upper film (anti-reflection film and the like) without including the upper substrate USUB.

An embodiment in which the first and second central areas INKA1 and INKA2 have a shape expanded in a relatively large area will be described with reference to FIG. 11 to FIG. 14. Descriptions that may be redundant to those described above are simplified or are not repeated.

Figure 14:
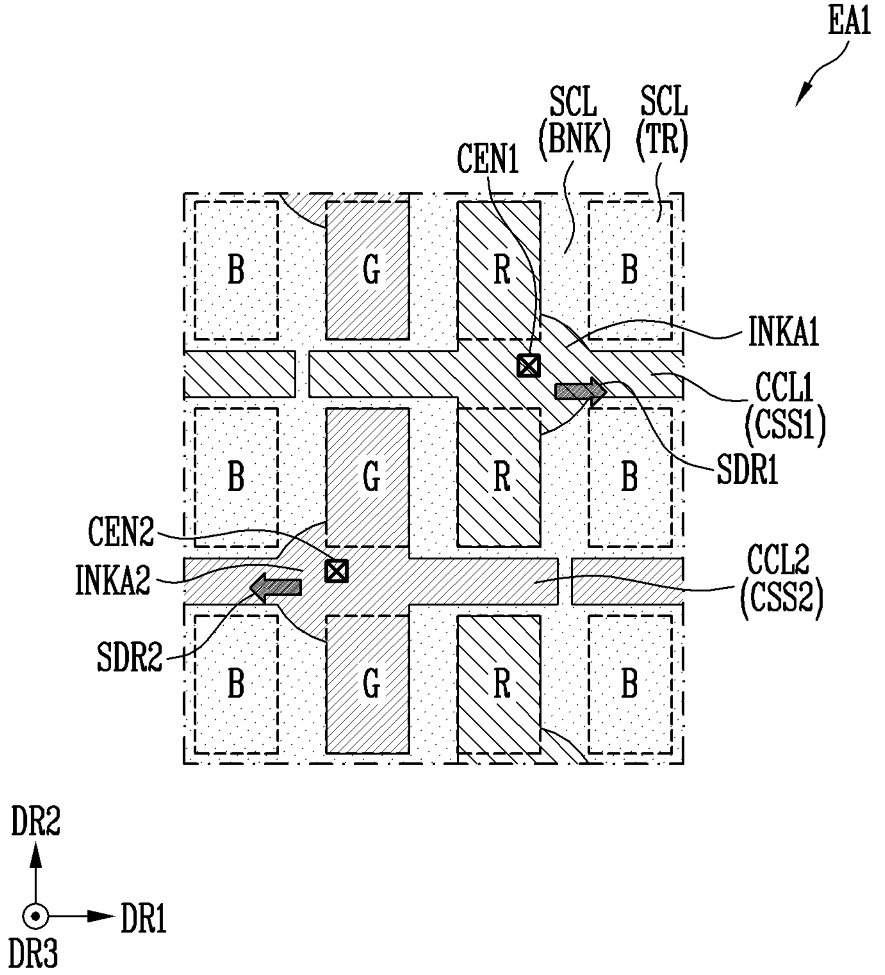

FIG. 11 to FIG. 14 illustrate schematic top plan views of a display device according to an embodiment. FIG. 11 to FIG. 14 schematically illustrate different structures of the first and second cross structures CSS1 and CSS2 of each of the first and second color conversion layers CCL1 and CCL2 according to an embodiment. FIG. 14 schematically illustrates a structure in which the first and second central areas INKA1 and INKA2 of the first and second cross structures CSS1 and CSS2 of each of the first and second color conversion layers CCL1 and CCL2 are shifted to be adjacent to the transmitting layer TR according to an embodiment.

Referring to FIG. 11 to FIG. 14, the first and second central areas INKA1 and INKA2 may include an extended area adjacent to the first and second arm areas ARM1 and ARM2.

For example, each of the first and second central areas INKA1 and INKA2 may further include an edge portion that does not overlap the first and second arm areas ARM1 and ARM2 along the first direction DR1. Each of the first and second central areas INKA1 and INKA2 may further include an edge portion that does not overlap the first and second arm areas ARM1 and ARM2 along the second direction DR2.

In this case, the process convenience of the inkjet process for manufacturing the first and second color conversion layers CCL1 and CCL2 may be improved.

In some embodiments (FIG. 11 and FIG. 13), each of the first and second central areas INKA1 and INKA2 may have a circular shape or an elliptical shape. In other embodiments (FIG. 12), each of the first and second central areas INKA1 and INKA2 may have a quadrangular shape.

In some embodiments, the first and second central areas INKA1 and INKA2 may be shifted to be adjacent to the light transmitting layer TR. It is a structure provided by shifting the positions of the first and second central areas INKA1 and INKA2, and the changes in the positions of the first and second central portions CEN1 and CEN2 are shown by arrows in an area EA1 of FIG. 14.

For example, the first central portion CEN1 in the first central area INKA1 may be formed to be adjacent to the third sub-pixel area SPXA3 with respect to the central line of the first sub-pixel area SPXA1. For example, the second sub-pixel area SPXA2 may be formed on the first side of the first sub-pixel area SPXA1, the third sub-pixel area SPXA3 may be formed on the second side of the first sub-pixel area SPXA1, and the first central portion CEN1 may be closer to the second side than the first side.

For example, the second central portion CEN2 in the second central area INKA2 may be formed to be adjacent to the third sub-pixel area SPXA3 with respect to the central line of the second sub-pixel area SPXA2. For example, the first sub-pixel area SPXA1 may be formed on the first side of the second sub-pixel area SPXA2, the third sub-pixel area SPXA3 may be formed on the second side of the second sub-pixel area SPXA2, and the second central portion CEN2 may be closer to the second side than the first side.

Accordingly, the first central portion CEN1 may be shifted to a first shift direction SDR1, and the second central portion CEN2 may be shifted to a second shift direction SDR2 that is different from the first shift direction SDR1.

In this case, the risk that the ink for manufacturing the first color conversion layer CCL1 is diffused into the area for providing the second color conversion layer CCL2 may be further prevented, and the risk that the ink for manufacturing the second color conversion layer CCL2 is diffused into the area for providing the first color conversion layer CCL1 may be further prevented.

For example, the light transmitting partition wall structure SCL may form the light transmitting layer TR while forming the bank BNK. Accordingly, even if the ink supply area for forming the first and second color conversion layers CCL1 and CCL2 is adjacent to the light transmitting layer TR, there may be no risk of color mixing between the sub-pixels SPX and of ink diffusing into unnecessary areas. As a result, the reliability of the inkjet process is improved, and a technical effect of further improving color quality may be provided.

A manufacturing method of the display device DD according to an embodiment will be described with reference to FIG. 15 to FIG. 24. Descriptions that may be redundant to those described above are simplified or are not repeated.

Figure 15:
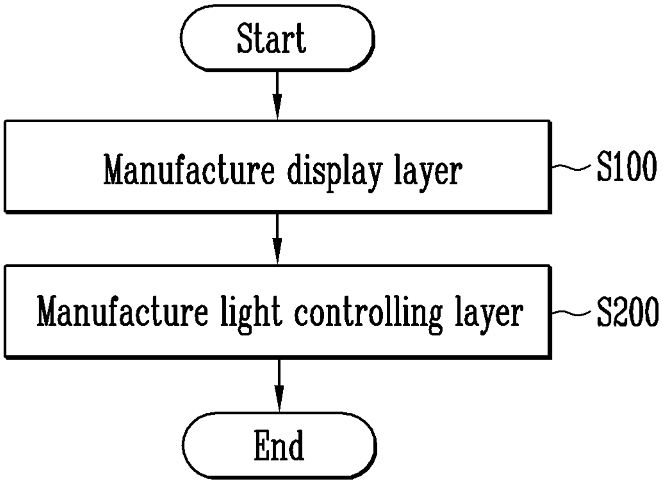
FIG. 15 illustrates a flowchart of a manufacturing method of a display device according to an embodiment.

FIG. 15 illustrates a flowchart of a manufacturing method of a display device according to an embodiment. FIG. 16 to FIG. 24 may illustrate step "S200" in FIG. 15.

FIG. 16 to FIG. 20 illustrate schematic cross-sectional views of process steps of a manufacturing method of a display device according to an embodiment. For better understanding and ease of description, FIG. 16 to FIG. 20 illustrate a cross-sectional structure based on the structure described above with reference to FIG. 6.

FIG. 21 to FIG. 24 illustrate schematic top plan views of process steps of a manufacturing method of a display device according to an embodiment. For better understanding and ease of description, FIG. 21 to FIG. 24 illustrate a planar structure based on the structure described above with reference to FIG. 4 and FIG. 5.

According to an embodiment, the manufacturing method of the display device DD may include manufacturing a display layer (S100) and manufacturing a light controlling layer (S100).

Referring to FIG. 15 together with FIG. 6, in the manufacturing of the display layer (S100), the pixel circuit layer PCL may be manufactured by patterning the pixel circuit PXC on the lower substrate BSUB, and the light emitting element LD may be disposed on the pixel circuit layer PCL to manufacture the light emitting element layer LEL. Accordingly, the display layer DL including the pixel circuit layer PCL and the light emitting element layer LEL may be manufactured.

In some embodiments, layers such as a conductive layer and an insulating layer on the lower substrate BSUB or the upper substrate USUB may be formed based on a conventional process for manufacturing a semiconductor device. For example, a conductive layer or an insulating layer on the lower substrate BSUB or the upper substrate BSUB may be formed by a photolithography process, etched by various methods (wet etching, dry etching, and the like), and deposited by various methods (sputtering, chemical vapor deposition, and the like). However, the disclosure is not necessarily limited to particular examples.

In the specification, the lower substrate BSUB may be referred to as a first substrate, and the upper substrate USUB may be referred to as a second substrate.

In case forming the light emitting element layer LEL, the light emitting elements LD may be manufactured by various methods. For example, the light emitting elements LD may include an organic light emitting diode, and the light emitting element LD may be manufactured by a deposition process on the lower substrate BSUB.

Accordingly, the display layer DL may be manufactured, and the first panel may be formed.

Figure 16:
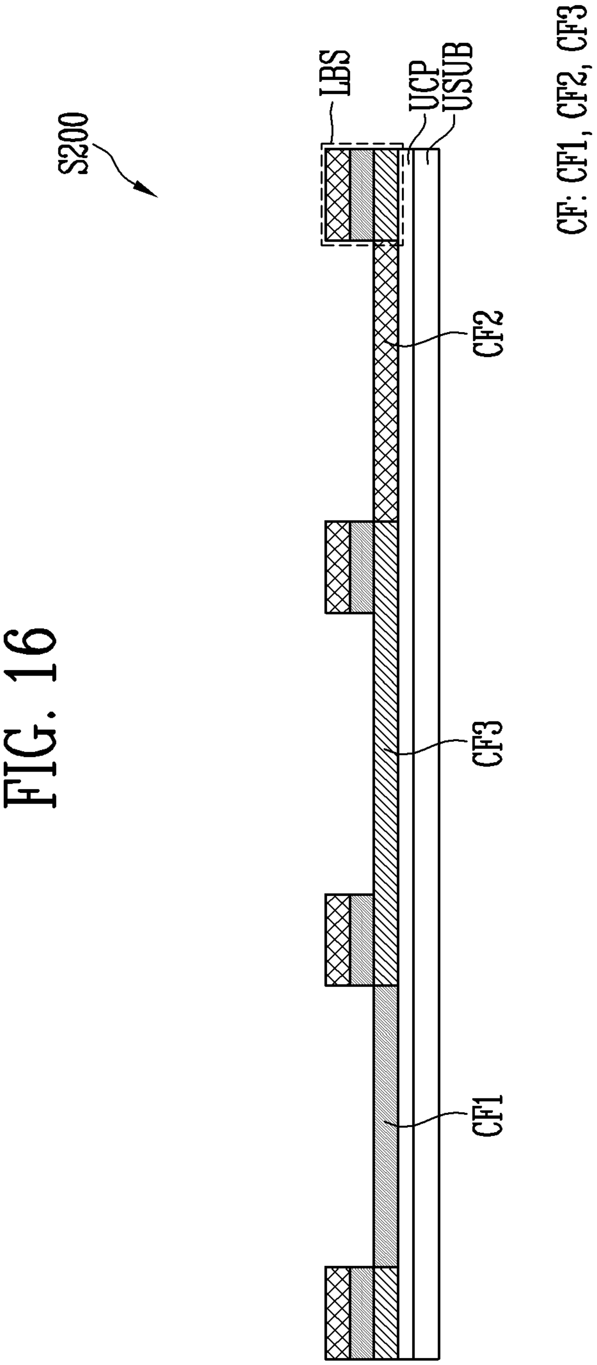
FIG. 16 to FIG. 20 illustrate schematic cross-sectional views of process steps of a manufacturing method of a display device according to an embodiment.

Referring to FIG. 15 and FIG. 16, in the manufacturing of the light controlling layer (S200), the upper capping layer UCP may be disposed on the upper substrate USUB, and the color filters CF may be patterned on the upper capping layer UCP.

In step S200, the third color filter CF3, the first color filter CF1, and the second color filter CF2 may be disposed on the upper substrate BSUB. The color filters CF may be formed by various processes, such as a photolithography process. In some embodiments, the formation order of the color filters CF is not particularly limited.

In some embodiments, in a plan view in a partial area, the first to third color filters CF1 to CF3 may overlap each other, and may form the light blocking structure LBS. In some embodiments, the light blocking structure LBS may prevent color mixing between adjacent sub-pixels SPXA. In some embodiments, the light blocking structure LBS may be patterned and defined so that the sub-pixel areas SPXA are clearly distinguished.

Figure 17:
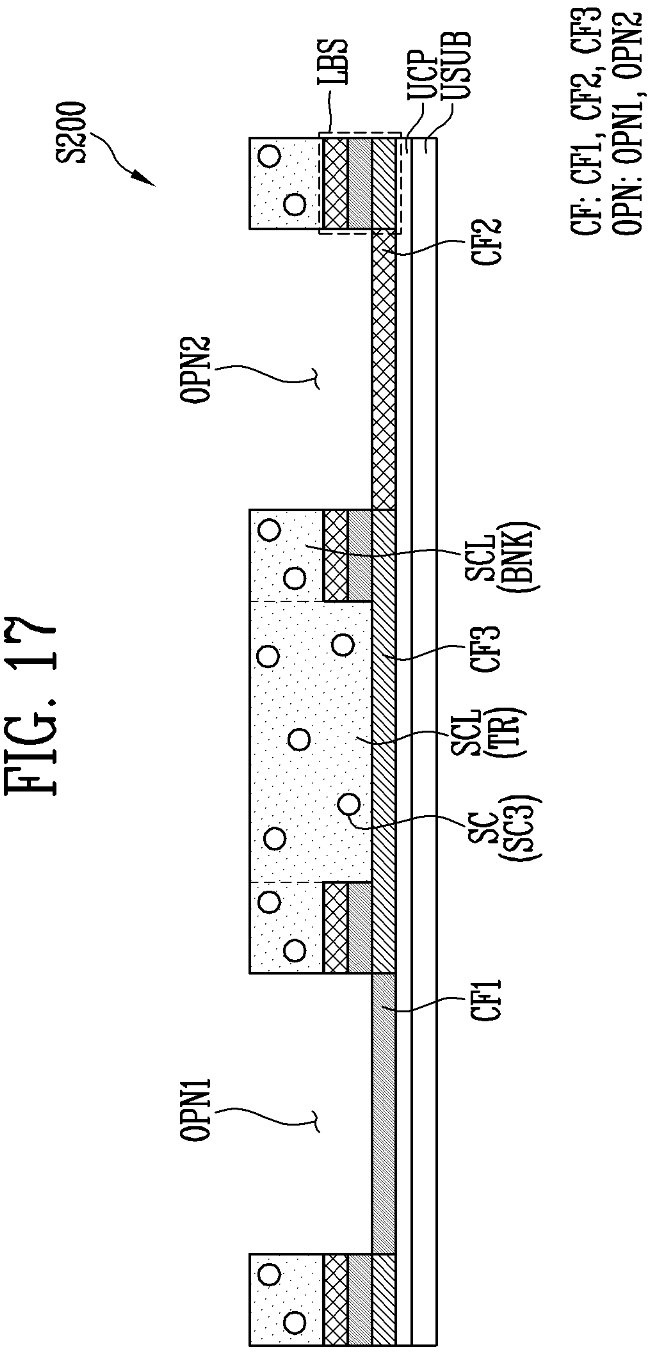
Figure 21:
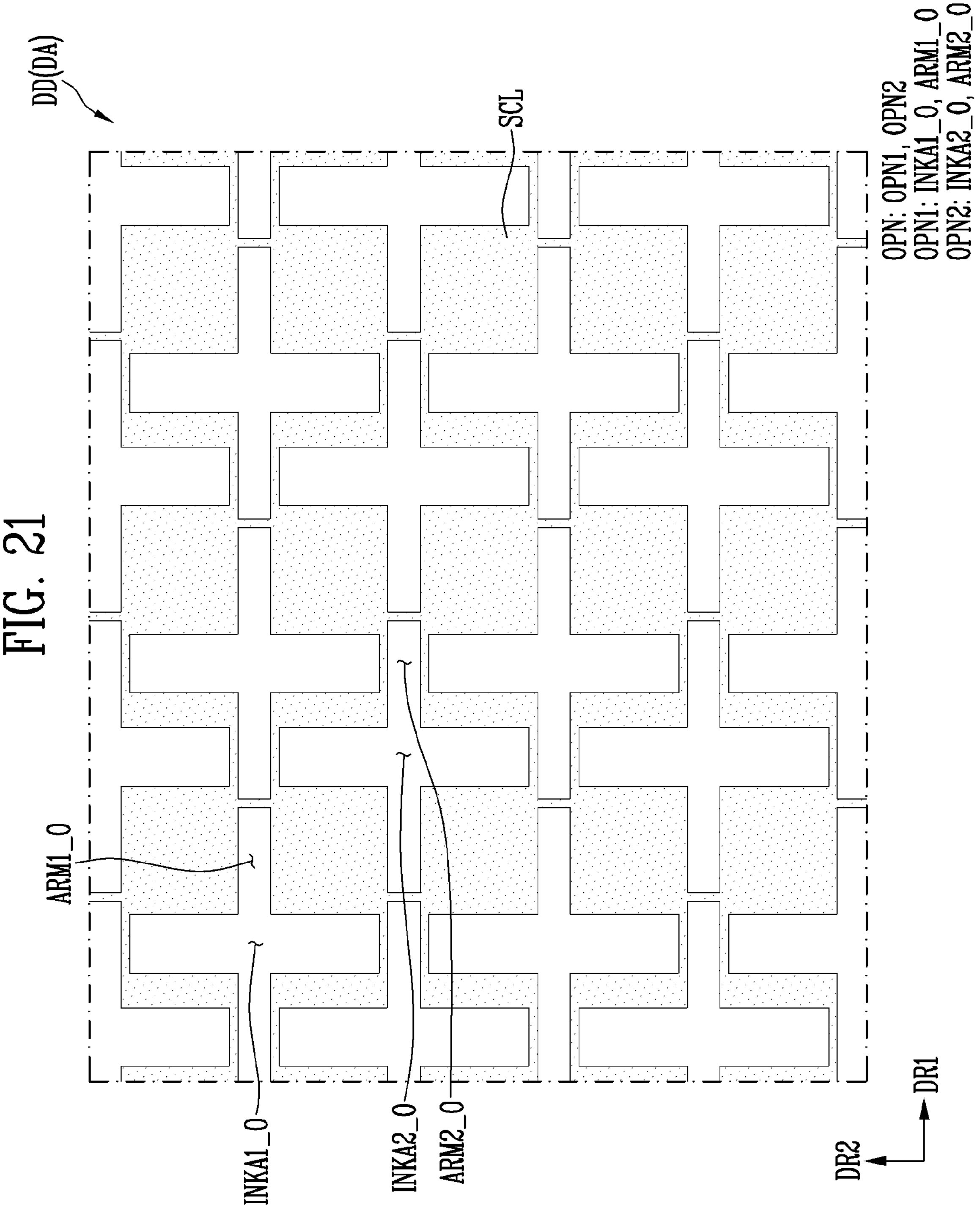
FIG. 21 to FIG. 24 illustrate schematic top plan views of process steps of a manufacturing method of a display device according to an embodiment.

Referring to FIG. 15, FIG. 17, and FIG. 21, in the manufacturing of the light controlling layer (S200), the light transmitting partition wall structure SCL may be patterned on the color filters CF. The light transmitting layer TR and the bank (BNK) of the light transmitting partition wall structure SCL may be manufactured in a same process.

In some embodiments, the light transmitting partition wall structure SCL may be manufactured by a photolithography process or the like.

In step S200, the light transmitting partition wall structure SCL may form the opening OPN. For example, the light transmitting partition wall structure SCL may form the bank BNK, and may expose at least a portion of each of the first color filter CF1 and the second color filter CF2.

In some embodiments, the opening OPN may include a first opening OPN1 and a second opening OPN2. The first opening OPN1 may be an area for supplying the first color conversion layer CCL1. The second opening OPN2 may be an area for supplying the second color conversion layer CCL2.

The first opening OPN1 may include a first central opening area INKA1_O and a first arm opening area ARM1_O. The first central opening area INKA1_O may correspond to the first central area INKA1. The first arm opening area ARM1_O may correspond to the first arm area ARM1.

The second opening OPN2 may include a second central opening area INKA2_O and a second arm opening area ARM2_O. The second central opening area INKA2_O may correspond to the second central area INKA2. The second arm opening area ARM2_O may correspond to the second arm area ARM2.

In step S200, at least a portion of the light transmitting partition wall structure SCL may be patterned so as not to overlap the light blocking structure LBS. For example, at least a portion of the light transmitting partition wall structure SCL may overlap a portion of the third color filter CF3, which does not form the light blocking structure LBS, and may form the light transmitting layer TR.

Figure 18:
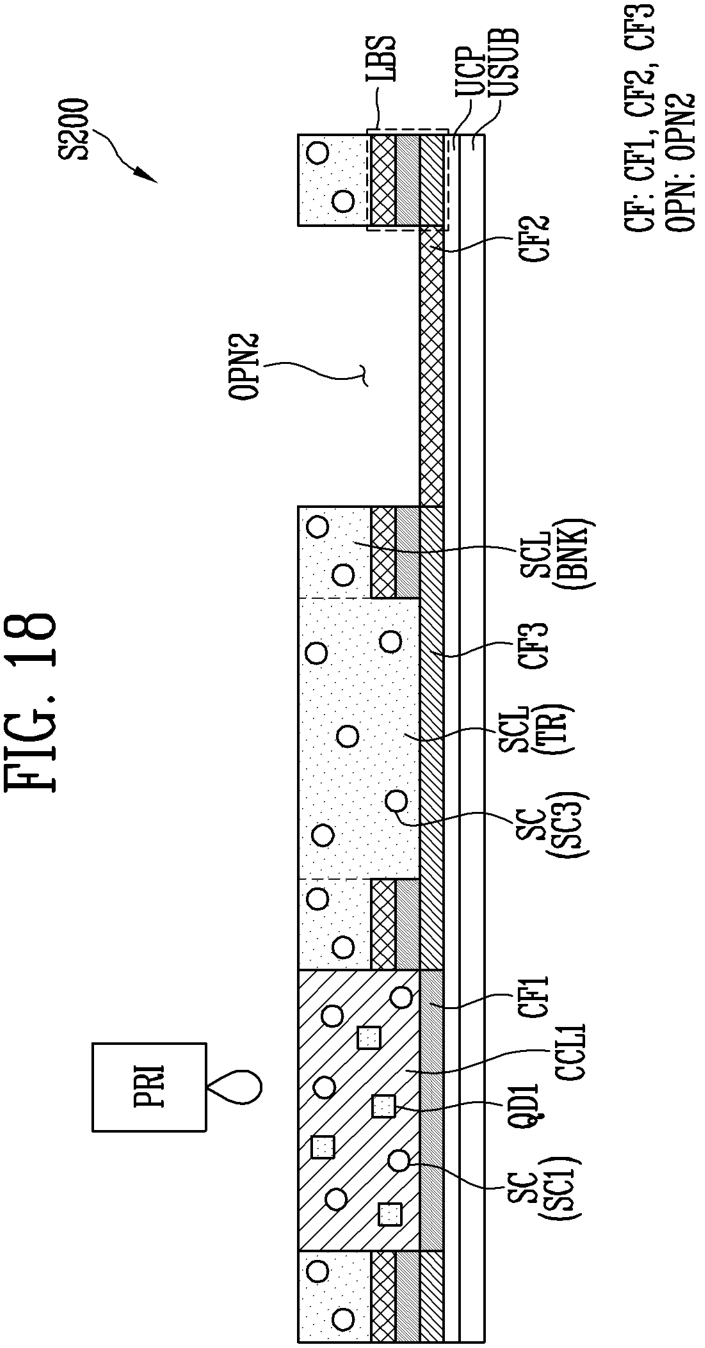
Figure 22:
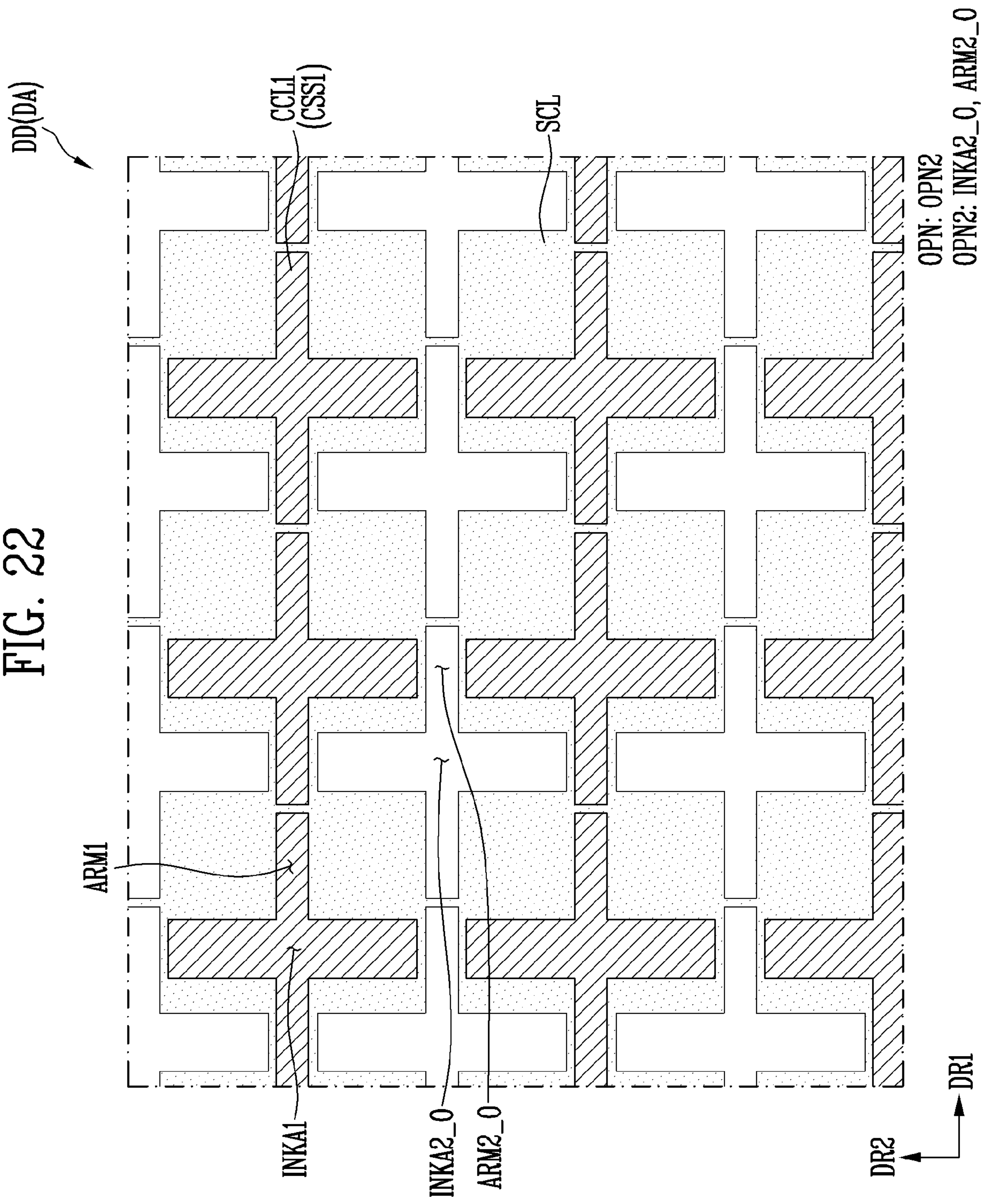

Referring to FIG. 15, FIG. 18, and FIG. 22, in the manufacturing of the light controlling layer (S200), a first inkjet process may be performed to pattern the first color conversion layer CCL1.

A printing device PRI may be a conventional inkjet equipment configured to perform an inkjet process. For example, the printing device PRI may include a nozzle configured to eject ink and the like.

In step S200, the first ink including the materials forming the first color conversion layer CCL1 in the first opening OPN1 may be supplied. For example, the first ink may include the first quantum-dot QD1, the scatterer SC, and the matrix material that disperses them.

In step S200, the first color conversion layer CCL1 may be patterned to correspond to the shape of the first opening OPN1. Accordingly, the first color conversion layer CCL1 forming the first cross structure CSS1 may be prepared. For example, the first color conversion layer CCL1 including the first central area INKA1 and the first arm area ARM1 may be manufactured.

According to an embodiment, due to the shape characteristics of the first opening OPN1, in case that the inkjet process step for manufacturing the first color conversion layer CCL1 is performed, the first color conversion layers CCL1 of each of the adjacent pixel rows PXR may be simultaneously manufactured.

Figure 19:
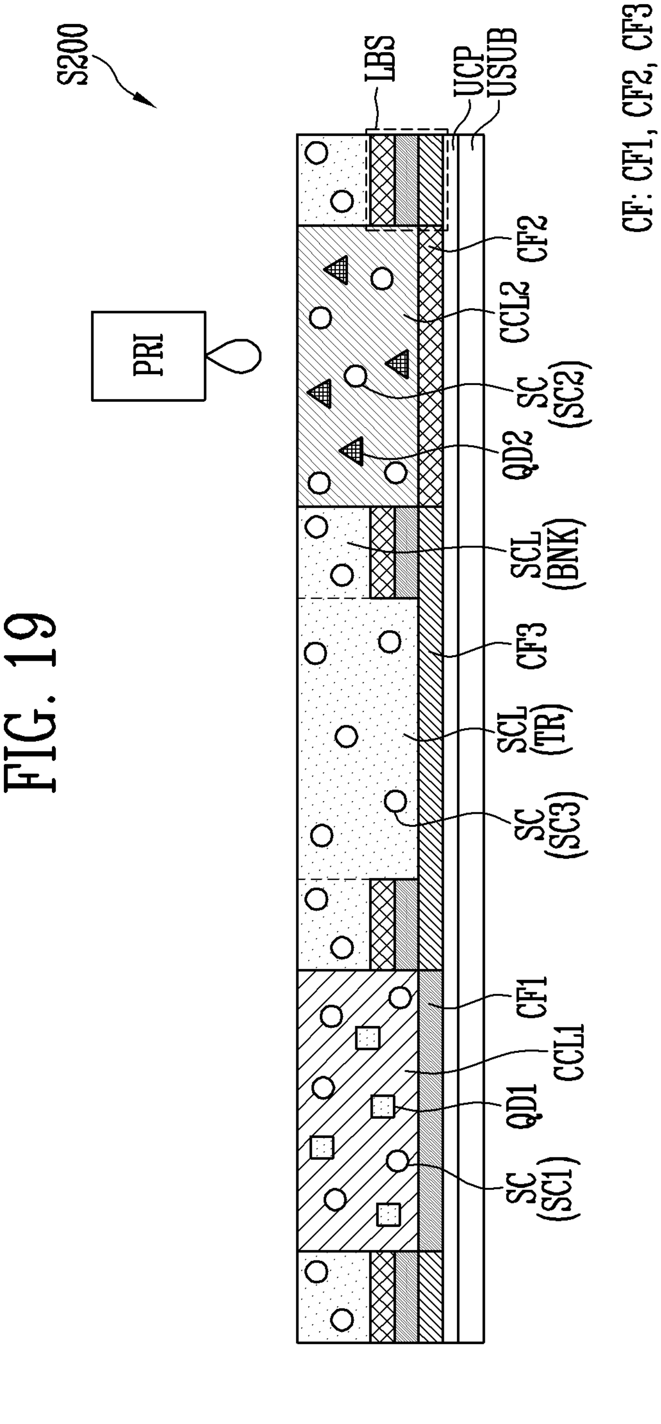
Figure 23:
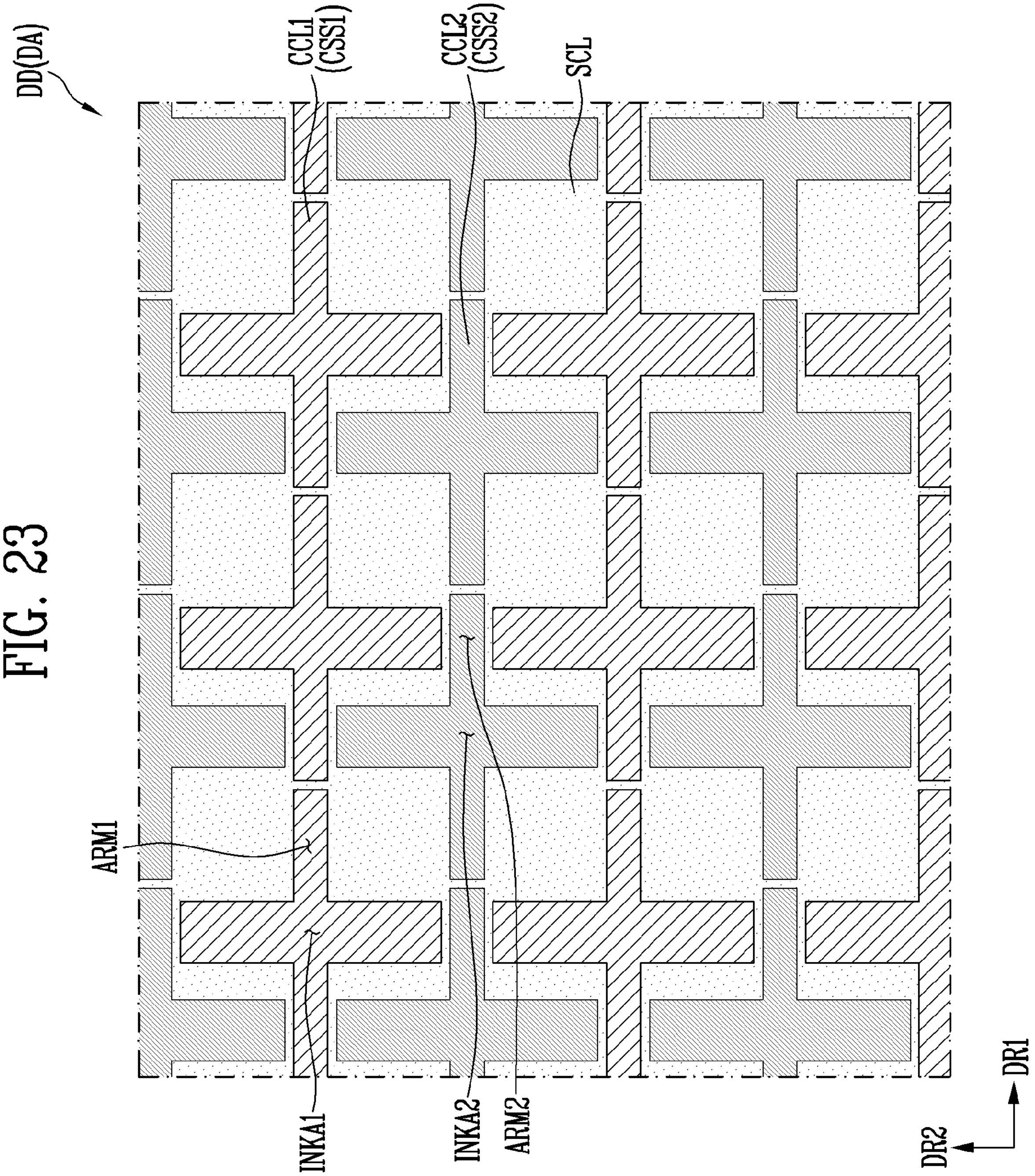

Referring to FIG. 15, FIG. 19, and FIG. 23, in the manufacturing of the light controlling layer (S200), a second inkjet process may be performed to pattern the second color conversion layer CCL2.

In step S200, the second ink including the materials forming the second color conversion layer CCL2 in the second opening OPN2 may be supplied. For example, the second ink may include the second quantum-dot QD2, the scatterer SC, and the matrix material that disperses them.

In step S200, the second color conversion layer CCL2 may be patterned to correspond to the shape of the second opening OPN2. Accordingly, the second color conversion layer CCL2 forming the second cross structure CSS2 may be prepared. For example, the second color conversion layer CCL2 including the second central area INKA2 and the second arm area ARM2 may be manufactured.

According to an embodiment, due to the shape characteristics of the second opening OPN2, in case that the inkjet process step for manufacturing the second color conversion layer CCL2 is performed, the second color conversion layers CCL2 of each of the adjacent pixel rows PXR may be simultaneously manufactured.

Figure 20:
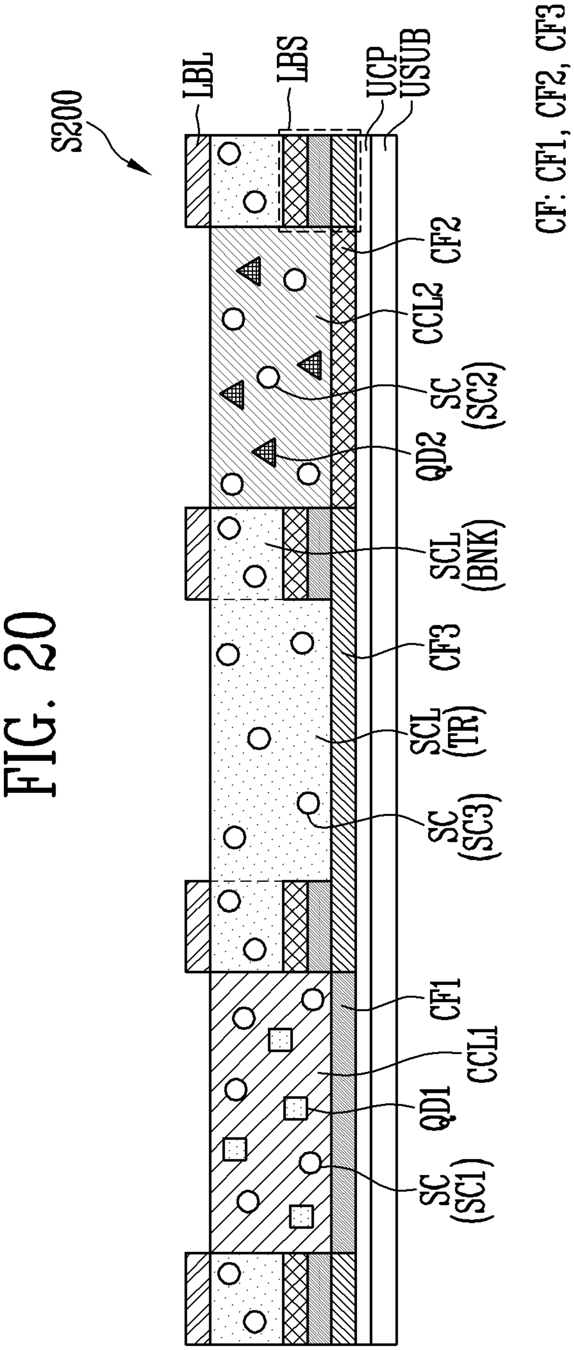
Figure 24:
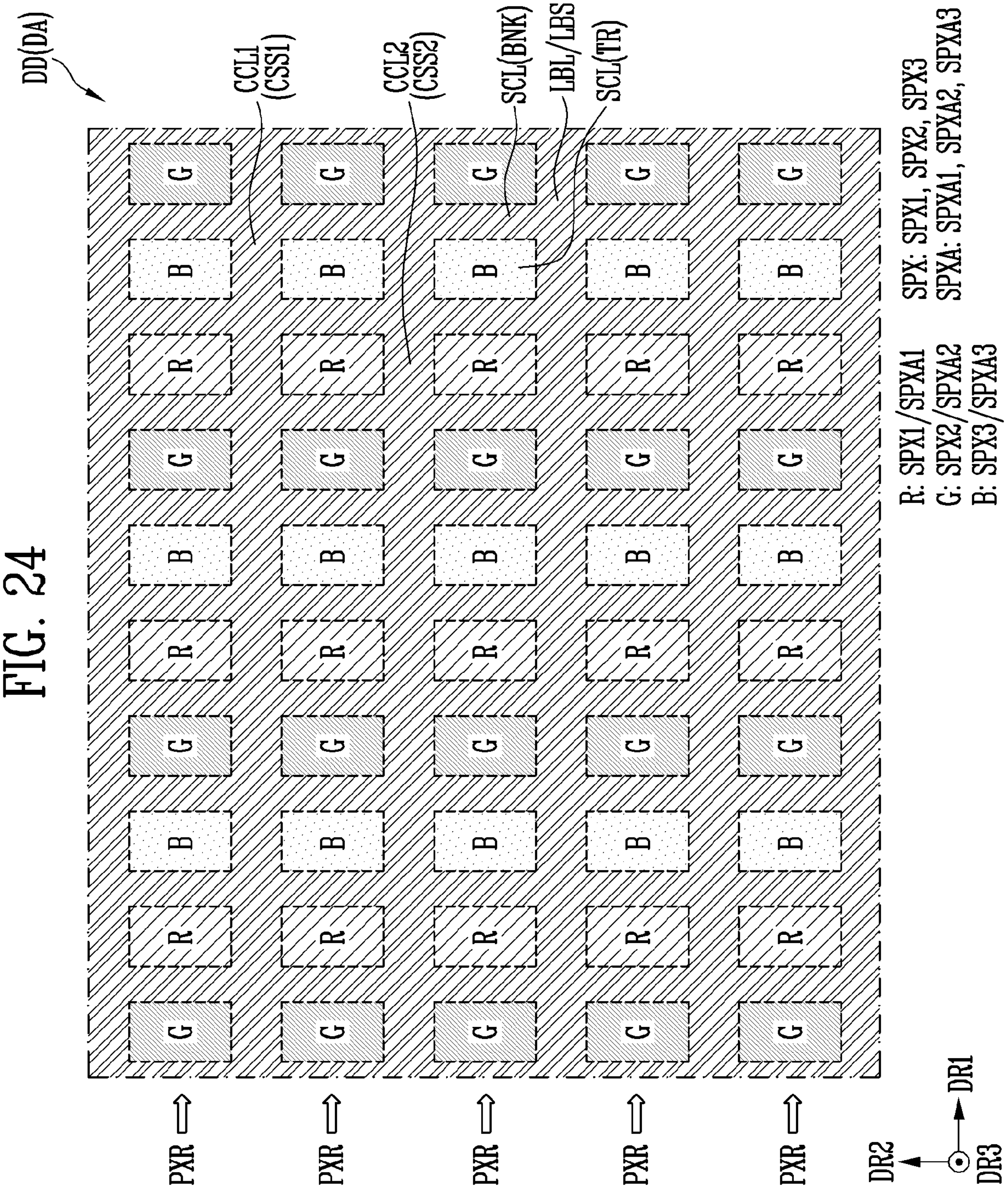

Referring to FIG. 15, FIG. 20, and FIG. 24, in the manufacturing of the light controlling layer (S200), the light blocking layer LBL may be patterned.

In the step, the light blocking layer LBL may be patterned to overlap the light blocking structure LBS in a plan view. The light blocking layer LBL may be defined (or disposed) in an area between adjacent sub-pixel areas SPXA.

Thereafter, although not shown in the drawing, in some embodiments, the capping layer QCP may be formed on the light blocking layer LBL to manufacture the second panel. The step of interposing the filling layer FIL between the first panel and the second panel as described above and coupling the first panel and the second panel is performed, so that the display device DD according to an embodiment may be provided.

While the disclosure has been shown and described with reference to certain embodiments thereof, it will be understood by those skilled in the art that various changes in forms and details may be made therein without departing from the spirit and scope of the disclosure.

What is claimed is:

1. A display device including a sub-pixel area and a non-sub-pixel area, comprising:

a display layer; and a light controlling layer disposed on the display layer, wherein the sub-pixel area includes a first sub-pixel area, a second sub-pixel area, and a third sub-pixel area;

the light controlling layer includes a first color conversion layer in which at least a portion thereof is disposed in the first sub-pixel area and including first quantum-dots, a second color conversion layer in which at least a portion thereof is disposed in the second sub-pixel area and including second quantum-dots, and a light transmitting partition wall structure disposed across the third sub-pixel area and the non-sub-pixel area;

the light transmitting partition wall structure includes a light transmitting layer disposed in the third sub-pixel area and a bank disposed in the non-sub-pixel area; and each of the first color conversion layer and the second color conversion layer includes a central area and an arm area extending in two or more different directions from the central area in a plan view.

2. The display device of claim 1, further comprising:

pixel rows in which the sub-pixel area is formed, that extend in a first direction, and that include pixel rows adjacent to each other in a second direction different from the first direction; and the central area overlapping the non-sub-pixel area in a plan view, and disposed between the pixel rows adjacent to each other.

3. The display device of claim 2, wherein the central area includes a first central area included in the first color conversion layer and a second central area included in the second color conversion layer, the arm area includes a first arm area included in the first color conversion layer and a second arm area included in the second color conversion layer, the first central area overlaps the first sub-pixel area along the second direction and does not overlap the first sub-pixel area along the first direction, the second central area overlaps the second sub-pixel area along the second direction and does not overlap the second sub-pixel area along the first direction, at least a portion of the first arm area is disposed in the first sub-pixel area, and at least a portion of the second arm area is disposed in the second sub-pixel area.

4. The display device of claim 3, wherein the first arm area includes a first sub-area, a second sub-area, a third sub-area, and a fourth sub-area that each extend in different directions in a plan view, and the second arm area includes a first sub-area, a second sub-area, a third sub-area, and a fourth sub-area that each extend in different directions in a plan view.

5. The display device of claim 4, wherein the first sub-pixel area includes first sub-pixel areas that are disposed respectively in the adjacent pixel rows to be spaced apart from each other in the second direction, the first sub-area of the first arm area is disposed in one of the first sub-pixel areas and the third sub-area of the first arm area is disposed in another of the first sub-pixel areas, and the second sub-area of the first arm area and the fourth sub-area of the first arm area are disposed between the adjacent pixel rows.

6. The display device of claim 4, wherein the first sub-area of the first arm area, the second sub-area of the first arm area, the first sub-area of the second arm area, and the second sub-area of the second arm area extend in a direction parallel to the first direction, the third sub-area of the first arm area, the fourth sub-area of the first arm area, the third sub-area of the second arm area, and the fourth sub-area of the second arm area extend in a direction parallel to the second direction, each of the third sub-area of the first arm area, the fourth sub-area of the first arm area, the third sub-area of the second arm area, and the fourth sub-area of the second arm area has a first width, each of the first sub-area of the first arm area, the second sub-area of the first arm area, the first sub-area of the second arm area, and the second sub-area of the second arm area has a second width, and the first width is greater than the second width.

7. The display device of claim 1, wherein the first color conversion layer includes first cross structures spaced apart from each other, the second color conversion layer includes second cross structures spaced apart from each other, the first and second cross structures are respectively arranged in a matrix structure based on a first direction and a second direction different from the first direction, each of the first cross structures includes a first central portion, each of the second cross structures includes a second central portion, and a virtual line connecting the first central portion and the second central portion extends in a diagonal direction different from the first direction and the second direction.

8. The display device of claim 7, wherein the first central portion and the second central portion form an offset with respect to the first direction.

9. The display device of claim 1, wherein the light controlling layer further includes color filters that are disposed on the first color conversion layer, the second color conversion layer, and the light transmitting partition wall structure, and a light blocking layer disposed on the bank in the non-sub-pixel area.

10. The display device of claim 1, wherein the bank and the light transmitting layer are integral to each other.

11. The display device of claim 1, wherein the light transmitting partition wall structure includes a scatterer.

12. The display device of claim 1, wherein the central area has at least one of a quadrangular shape, a circular shape, and an elliptical shape.

13. The display device of claim 3, wherein the first central area and the second central area further include edge portions that do not overlap the first arm area and the second arm area along the first direction, respectively.

14. The display device of claim 13, wherein the first central area is closer to the third sub-pixel area than to the second sub-pixel area, and the second central area is closer to the third sub-pixel area than to the first sub-pixel area.

15. The display device of claim 14, wherein the first central area includes a first central portion, the second central area includes a second central portion, the first central portion is closer to the third sub-pixel area than to the second sub-pixel area with respect to a central line of the first sub-pixel area, and the second central portion is closer to the third sub-pixel area than to the first sub-pixel area with respect to a central line of the second sub-pixel area.

16. A display device, comprising:

a display layer;

a first color conversion layer disposed on the display layer and that includes quantum-dots; and a second color conversion layer disposed on the display layer and that includes quantum-dots, wherein the first color conversion layer includes first cross structures spaced apart from each other;

the second color conversion layer includes second cross structures spaced apart from each other;

the first and second cross structures are respectively arranged in a matrix structure based on a first direction and a second direction different from the first direction;

each of the first cross structures includes a first central portion;

each of the second cross structures includes a second central portion; and a virtual line connecting the first central portion and the second central portion extends in a diagonal direction different from the first direction and the second direction.

17. A manufacturing method of display device, comprising:

manufacturing a display layer including a first substrate; and manufacturing a light controlling layer including a second substrate, wherein the manufacturing of the light controlling layer includes:

patterning color filters on the second substrate;

patterning a light transmitting partition wall structure on the color filters;

patterning a first color conversion layer on the color filters; and patterning a second color conversion layer on the color filters, the patterning of the light transmitting partition wall structure includes forming a first opening by the light transmitting partition wall structure and forming a second opening by the light transmitting partition wall structure, the first opening includes a first central opening and a first arm opening extending from the first central opening, the second opening includes a second central opening and a second arm opening extending from the second central opening, the patterning of the first color conversion layer includes supplying a first ink including first quantum-dots to the first opening, and the patterning of the second color conversion layer includes supplying a second ink including second quantum-dots to the second opening.

18. The manufacturing method of the display device of claim 17, wherein the first arm opening includes two or more first arm openings extending in different directions, and the second arm opening includes two or more second arm openings extending in different directions.

19. The manufacturing method of the display device of claim 17, wherein the patterning of the first color conversion layer includes simultaneously disposing the first color conversion layer in first sub-pixel areas respectively corresponding to pixel rows.

20. The manufacturing method of the display device of claim 17, wherein the color filters include a first color filter, a second color filter, and a third color filter, the patterning of the color filters includes forming a light blocking structure by the first color filter, the second color filter, and the third color filter, and the manufacturing method further includes patterning a light blocking layer on at least a portion of the light transmitting partition wall structure.

* * * * *